United States Patent
Youn et al.

(10) Patent No.: US 9,379,019 B2
(45) Date of Patent: Jun. 28, 2016

(54) METHODS OF MANUFACTURING A SEMICONDUCTOR DEVICE

(71) Applicants: Bum-Joon Youn, Suwon-si (KR); Tae-Sun Kim, Hwaseong-si (KR); Yeo-Jin Lee, Seoul (KR); Yu-Ra Kim, Hwaseong-si (KR); Jin-Man Kim, Yongin-si (KR); Jae-Kyung Seo, Yongin-si (KR); Ki-Man Lee, Yongin-si (KR)

(72) Inventors: Bum-Joon Youn, Suwon-si (KR); Tae-Sun Kim, Hwaseong-si (KR); Yeo-Jin Lee, Seoul (KR); Yu-Ra Kim, Hwaseong-si (KR); Jin-Man Kim, Yongin-si (KR); Jae-Kyung Seo, Yongin-si (KR); Ki-Man Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/701,859

(22) Filed: May 1, 2015

(65) Prior Publication Data

US 2016/0099177 A1 Apr. 7, 2016

(30) Foreign Application Priority Data

Oct. 6, 2014 (KR) .................. 10-2014-0134057

(51) Int. Cl.
*H01L 21/8234* (2006.01)
*H01L 21/02* (2006.01)
*H01L 21/027* (2006.01)
*H01L 21/265* (2006.01)
*H01L 29/66* (2006.01)
*H01L 21/762* (2006.01)
*H01L 21/266* (2006.01)

(52) U.S. Cl.
CPC .... *H01L 21/823431* (2013.01); *H01L 21/0276* (2013.01); *H01L 21/266* (2013.01); *H01L 21/26513* (2013.01); *H01L 21/76224* (2013.01); *H01L 21/823418* (2013.01); *H01L 21/823437* (2013.01); *H01L 21/823481* (2013.01); *H01L 29/66545* (2013.01); *H01L 29/66636* (2013.01)

(58) Field of Classification Search
CPC ................... H01L 21/823431; H01L 21/0276; H01L 21/26513; H01L 21/266; H01L 21/76224; H01L 21/823418; H01L 21/823437; H01L 21/823481
See application file for complete search history.

(56) References Cited

U.S. PATENT DOCUMENTS

| | | | | |
|---|---|---|---|---|
| 4,600,445 | A | * | 7/1986 | Horr ................... H01L 21/0334 257/372 |
| 6,057,587 | A | * | 5/2000 | Ghandehari ............ G03F 7/091 257/435 |

(Continued)

FOREIGN PATENT DOCUMENTS

| | | |
|---|---|---|
| JP | 06333817 | 2/1994 |
| JP | 08064492 | 8/1996 |

(Continued)

*Primary Examiner* — Mamadou Diallo
(74) *Attorney, Agent, or Firm* — Harness, Dickey & Pierce

(57) ABSTRACT

In a method, an isolation layer pattern is formed on a substrate to define first and second active fins. An ARC layer is formed on the isolation layer pattern to at least partially cover sidewalls of the first and second active fins. A level of a top surface of the ARC layer is equal to or less than, and equal to or greater than half of, those of the first and second active fins. A photoresist layer is formed on the first and second active fins and the ARC layer. A portion of the photoresist layer is removed to form a photoresist pattern covering the first active fin and exposing the second active fin. A portion of the ARC layer under the removed portion of the photoresist layer is removed to form an ARC layer pattern. Impurities are implanted into the exposed second active fin to form an impurity region.

20 Claims, 41 Drawing Sheets

(56) References Cited

U.S. PATENT DOCUMENTS

| | | |
|---|---|---|
| 8,530,356 B2 | 9/2013 | Gouk et al. |
| 8,592,956 B2 | 11/2013 | Ogihara et al. |
| 8,668,837 B2 | 3/2014 | Doan et al. |
| 2003/0104710 A1* | 6/2003 | Visokay .......... H01L 21/823842 438/798 |
| 2003/0228741 A1* | 12/2003 | Schafbauer ........... H01L 21/266 438/531 |
| 2005/0280098 A1* | 12/2005 | Shin ................ H01L 21/823814 257/371 |
| 2006/0131656 A1* | 6/2006 | Shin ..................... H01L 21/265 257/369 |
| 2009/0226672 A1 | 9/2009 | Meador et al. |
| 2011/0076843 A1* | 3/2011 | Huang .................... G03F 7/093 438/585 |
| 2012/0264305 A1 | 10/2012 | Nakano |
| 2013/0171569 A1 | 7/2013 | Tachibana et al. |
| 2014/0145242 A1 | 5/2014 | Huang et al. |

FOREIGN PATENT DOCUMENTS

| | | |
|---|---|---|
| KR | 20040080238 A | 9/2004 |
| KR | 20060028220 A | 3/2006 |
| KR | 20090100079 A | 9/2009 |
| KR | 20110034843 A | 4/2011 |

* cited by examiner

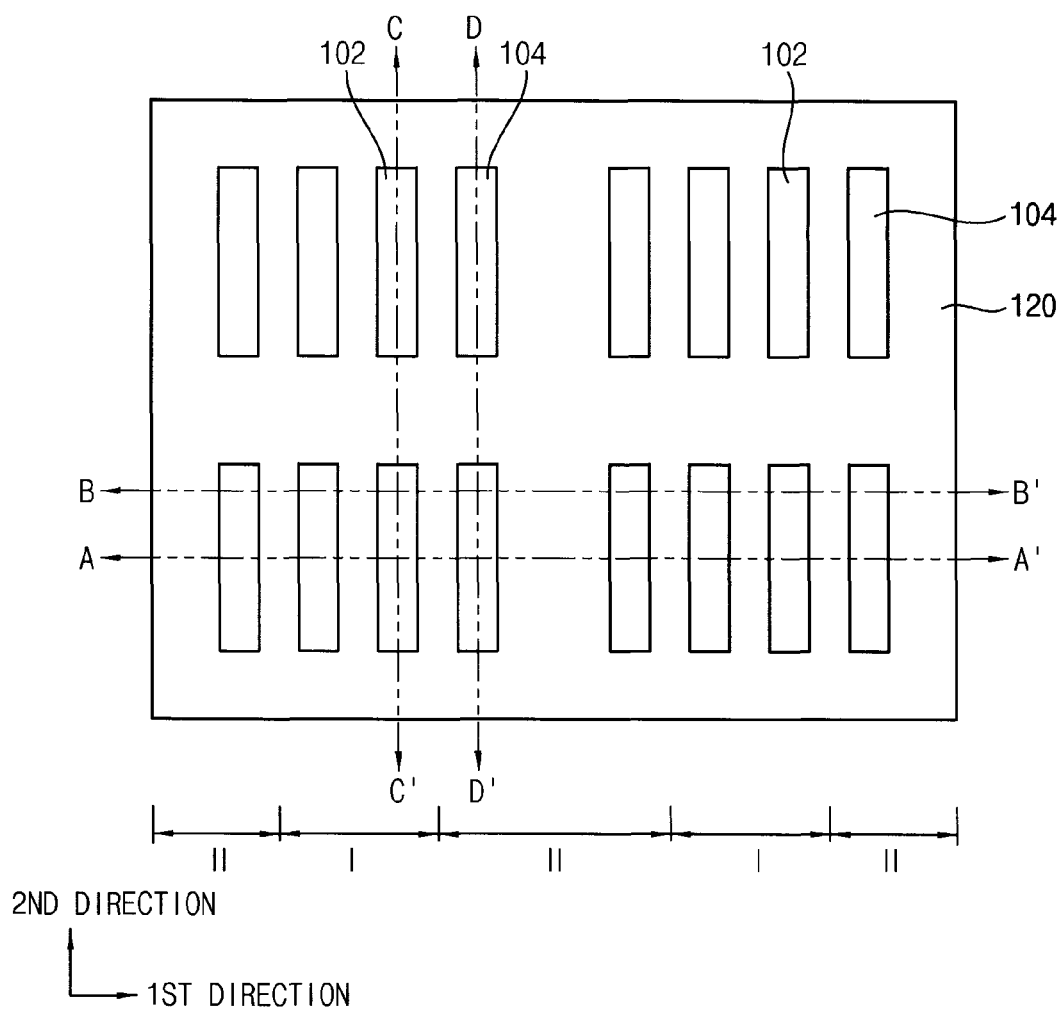

2ND DIRECTION
⊗ ⟶ 1ST DIRECTION

2ND DIRECTION
⊗ ⟶ 1ST DIRECTION

1ST DIRECTION
⊗→ 2ND DIRECTION

2ND DIRECTION
↳ 1ST DIRECTION

2ND DIRECTION
⊗ ← 1ST DIRECTION

2ND DIRECTION
⊗ ← 1ST DIRECTION

1ST DIRECTION
⊗ ⟶ 2ND DIRECTION

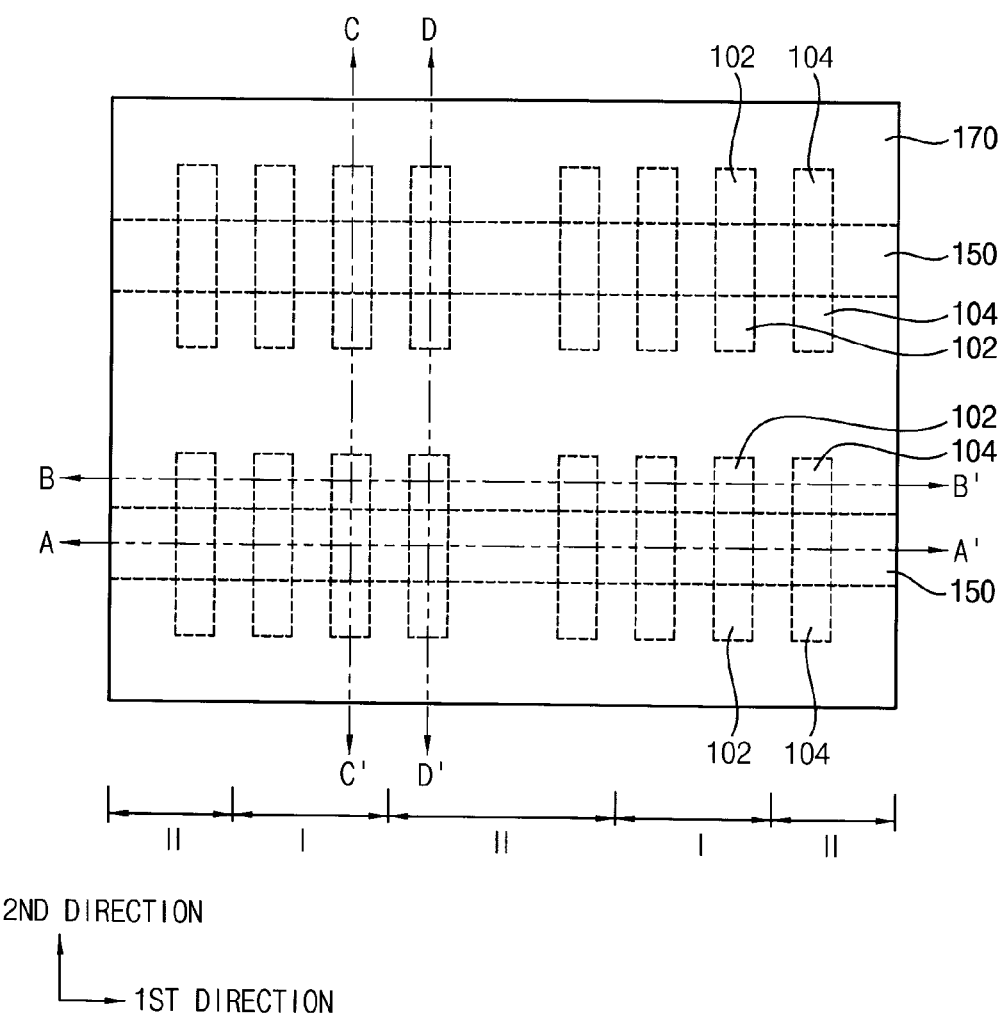

1ST DIRECTION
⊗ ← 2ND DIRECTION

2ND DIRECTION
⊗⎯⎯ 1ST DIRECTION

2ND DIRECTION
⊗⎯⎯ 1ST DIRECTION

1ST DIRECTION
⊗——— 2ND DIRECTION

2ND DIRECTION
⊗⟶ 1ST DIRECTION

2ND DIRECTION
⊗⟶ 1ST DIRECTION

1ST DIRECTION
⊗⟶ 2ND DIRECTION

2ND DIRECTION
⊗ — 1ST DIRECTION

2ND DIRECTION
⊗ — 1ST DIRECTION

1ST DIRECTION
⊗ ── 2ND DIRECTION

1ST DIRECTION
⊗ ── 2ND DIRECTION

1ST DIRECTION
⊗ ← 2ND DIRECTION

1ST DIRECTION
⊗ ← 2ND DIRECTION

1ST DIRECTION
⊗ ⟶ 2ND DIRECTION

2ND DIRECTION
⊗ — 1ST DIRECTION

2ND DIRECTION
⊗ — 1ST DIRECTION

2ND DIRECTION
⊗ ← 1ST DIRECTION

1ST DIRECTION
⊗ ← 2ND DIRECTION

METHODS OF MANUFACTURING A SEMICONDUCTOR DEVICE

CROSS-REFERENCE TO RELATED APPLICATION

This U.S. non-provisional patent application claims priority under 35 U.S.C. §119 to Korean Patent Application No. 10-2014-0134057, filed on Oct. 6, 2014 in the Korean Intellectual Property Office (KIPO), the contents of which are herein incorporated by reference in their entirety.

BACKGROUND

1. Field

Some example embodiments relate to methods of manufacturing a semiconductor device. More particularly, some example embodiments relate to methods of manufacturing a semiconductor device including an impurity region.

2. Discussion of Related Art

When a photoresist pattern serving as an ion implantation mask is formed, a photoresist layer may be formed and patterned by a lithography process. As a semiconductor device has been highly integrated, the photoresist pattern may not be formed to have a vertical sidewall due to diffused reflection, and thus ions may be implanted into an undesired portion to deteriorate characteristics of the semiconductor device. In order to reduce or prevent the diffused reflection, a bottom anti-reflective coating (BARC) layer may be formed on a substrate, however, the substrate may be damaged when the BARC layer is subsequently etched.

SUMMARY

Some example embodiments provide a method of manufacturing a semiconductor device having good characteristics.

In an example embodiment of the inventive concepts, there is provided a method of manufacturing a semiconductor device. In the method, an isolation layer pattern is formed on a substrate to define first and second active fins protruding from the isolation layer pattern. A first anti-reflective coating (ARC) layer is formed on the isolation layer pattern to at least partially cover sidewalls of the first and second active fins. A level of a top surface of the first ARC layer is equal to or less than those of the first and second active fins and equal to or greater than half of those of the first and second active fins. A first photoresist layer is formed on the first and second active fins and the first ARC layer. A portion of the first photoresist layer is removed to form a first photoresist pattern covering the first active fin and exposing the second active fin. A portion of the first ARC layer under the removed portion of the first photoresist layer is also removed to form a first ARC layer pattern. Impurities are implanted into the exposed second active fin to form a first impurity region.

In an example embodiment, when the first photoresist pattern is formed, an exposure process may be performed on the first photoresist layer, and developing solution may be coated on the first photoresist layer.

In an example embodiment, the exposure process may be performed using KrF, ArF, extreme ultra violet (EUV), vacuum ultra violet (VUV), electron beam, X-ray, or ion beam.

In an example embodiment, the portion of the first ARC layer under the removed portion of the first photoresist layer may be isotropically etched by the developing solution.

In an example embodiment, the first active fin may be covered by the first photoresist pattern and the first ARC layer pattern not to be exposed.

In an example embodiment, the first ARC layer may not cover the top surfaces of the first and second active fins.

In an example embodiment, the second active fin may be covered neither by the first photoresist pattern nor by the first ARC layer pattern.

In an example embodiment, after the first impurity region is formed, the first photoresist pattern and the first ARC layer pattern may be removed.

In an example embodiment, after the first photoresist pattern and the first ARC layer pattern are removed, a second ARC layer may be formed on the isolation layer pattern to at least partially cover the sidewalls of the first and second active fins. A level of a top surface of the second ARC layer may be equal to or less than those of the first and second active fins and equal to or greater than half of those of the first and second active fins. A second photoresist layer may be formed on the first and second active fins and the second ARC layer. A portion of the second photoresist layer may be removed to form a second photoresist pattern covering the second active fin and exposing the first active fin. A portion of the second ARC layer under the removed portion of the second photoresist layer may be also removed to form a second ARC layer pattern. Impurities may be implanted into the exposed first active fin to form a second impurity region.

In an example embodiment, the first and second impurity regions may be formed to include impurities having different conductivity type.

In an example embodiment, the first photoresist pattern and the first Arc layer pattern may be removed by an ashing process and/or a stripping process.

In an example embodiment, before the first ARC layer is formed on the isolation layer pattern, a dummy gate structure may be formed on the first and second active fins. The first impurity region may be formed at an upper portion of the second active fin adjacent to the dummy gate structure.

In an example embodiment, when the dummy gate structure is formed, a dummy gate insulation layer pattern and a dummy gate electrode sequentially stacked may be formed on the first and second active fins.

In an example embodiment, after the first impurity region is formed, a spacer may be formed on a sidewall of the dummy gate structure. An insulating interlayer surrounding the dummy gate structure and the spacer may be formed. The dummy gate electrode and the dummy gate insulation layer pattern may be removed to form an opening exposing top surfaces of the first and second active fins. A high-k dielectric layer pattern may be formed on the exposed top surfaces of the first and second active fins and a sidewall of the opening. A gate electrode may be formed to fill a remaining portion of the opening. The high-k dielectric layer pattern and the gate electrode may form a gate structure.

In an example embodiment, before the high-k dielectric layer pattern is formed, an oxide layer pattern may be formed on the exposed top surfaces of the first and second active fins.

In an example embodiment, after the first impurity region is formed, a spacer may be formed on a sidewall of the dummy gate structure. An upper portion of the second active fin covered neither by the dummy gate structure nor by the spacer may be removed to form a recess. A source/drain layer may be formed on the recess.

In another example embodiment of the inventive concepts, there is provided a method of manufacturing a semiconductor device. In the method, an isolation layer pattern is formed on a substrate to define first and second active fins protruding from the isolation layer pattern. An anti-reflective coating (ARC) layer is formed on the isolation layer pattern to at least partially cover sidewalls of the first and second active fins. A level of a top surface of the ARC layer is equal to or greater than half of those of the first and second active fins. A photoresist layer is formed on the first and second active fins and the ARC layer. An exposure process and a development process are performed on the photoresist layer to remove a portion of the photoresist layer so that a photoresist pattern overlapping the first active fin and not overlapping the second active fin is formed. A portion of the ARC layer under the removed portion of the photoresist layer is also removed to form an ARC layer pattern covering at least a lower sidewall of the first active fin and not covering the second active fin. The second active fin is exposed. Impurities are implanted into the exposed second active fin to form an impurity region.

In an example embodiment, the ARC layer may not cover top surfaces of the first and second active fins.

In an example embodiment, the ARC layer may cover top surfaces of the first and second active fins.

In still another example embodiment of the inventive concepts, there is provided a method of manufacturing a semiconductor device. In the method, an isolation layer pattern is formed on a substrate to define a plurality of active fins protruding from the isolation layer pattern. An anti-reflective coating (ARC) layer is formed on the isolation layer pattern to at least partially cover sidewalls of the active fins. A level of a top surface of the ARC layer is less than levels of top surfaces of the active fins. A photoresist layer is formed on the active fins and the ARC layer. A portion of the photoresist layer is removed to form a photoresist pattern covering some of the plurality of active fins and exposing others of the plurality of active fins. A portion of the ARC layer under the removed portion of the photoresist layer is also removed to form an ARC layer pattern. Impurities are implanted into the exposed active fins to form an impurity region.

According to an example embodiment, a developable ARC layer may be formed between a substrate and a photoresist layer, and thus, when a photoresist pattern is formed by a development process, a portion of the ARC layer under the photoresist layer may be also removed. Thus, the ARC layer may be removed with no additional etching process to expose an active region of the substrate, and a top surface of the active region may not be damaged.

Particularly, a top surface of the ARC layer may have a height equal to or greater than half of a top surface of the active region and equal to or less than the top surface of the active region, and thus the diffused reflection of light may be reduced or prevented during an exposure process on the photoresist layer. Additionally, when the ARC layer may be removed to form an ARC layer pattern by an isotropical etching process during a development process, the ARC layer pattern may expose only a desired portion of the active region and sufficiently cover other portions of the active region. As a result, an impurity region may be formed at a desired portion of the active region with a desired conductivity type, and a semiconductor device having good electrical characteristics may be manufactured.

BRIEF DESCRIPTION OF THE DRAWINGS

Example embodiments will be more clearly understood from the following detailed description taken in conjunction with the accompanying drawings. FIGS. 1 to 55 represent non-limiting, example embodiments as described herein.

FIGS. 1 to 48 are plan views and cross-sectional views illustrating stages of a method of manufacturing a semiconductor device in accordance with some example embodiments.

FIGS. 49 to 55 are plan views and cross-sectional views illustrating stages of a method of manufacturing a semiconductor device in accordance with Comparative Example.

DESCRIPTION OF EMBODIMENTS

Figure 2A:
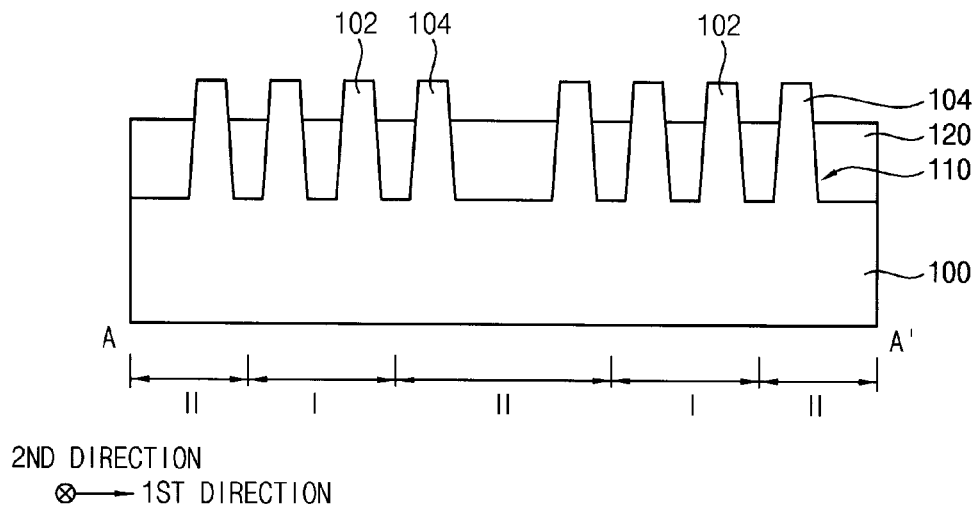

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 48 are plan views and cross-sectional views illustrating stages of a method of manufacturing a semiconductor device in accordance with example embodiments. Particularly, FIGS. 1, 4, 8, 12, 16, 20, 24, 28, 33, 37, 41 and 44 are plan views, and FIGS. 2-3, 5-7, 9-11, 13-15, 17-19, 21-23, 25-27, 29-32, 34-36, 38-40, 42-43 and 45-48 are cross-sectional views.

FIGS. 2, 5, 9, 13, 17, 21, 25, 29, 42 and 45 are cross-sectional views taken along a line A-A' of corresponding plan views, FIGS. 6, 10, 14, 18, 22, 26, 30, 34, 38 and 46 are cross-sectional views taken along a line B-B' of corresponding plan views, FIGS. 3, 7, 11, 15, 27, 31, 35, 39, 43 and 47 are cross-sectional views taken along a line C-C' of corresponding plan views, and FIGS. 19, 23, 32, 36, 40 and 48 are cross-sectional views taken along a line D-D' of corresponding plan views.

Figure 49:
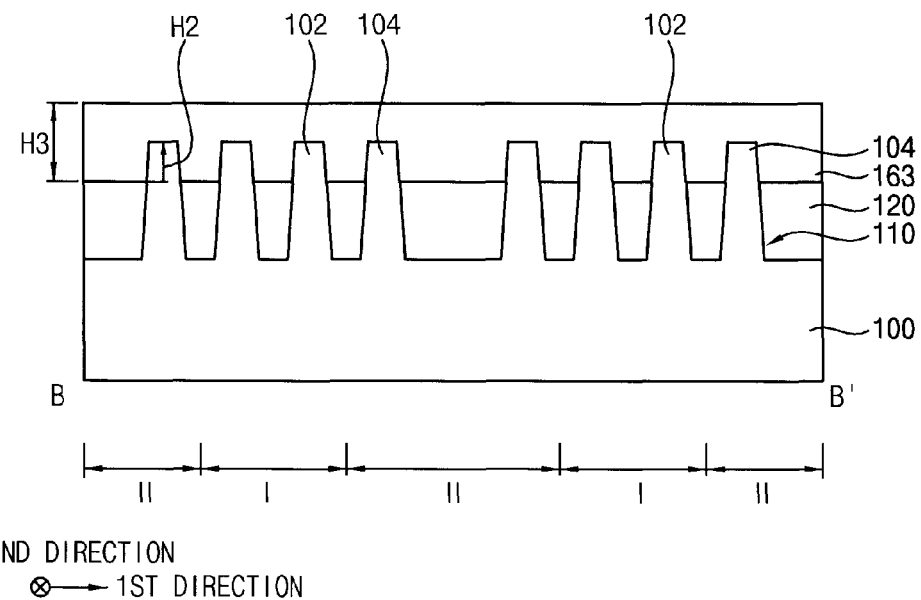
Figure 50:
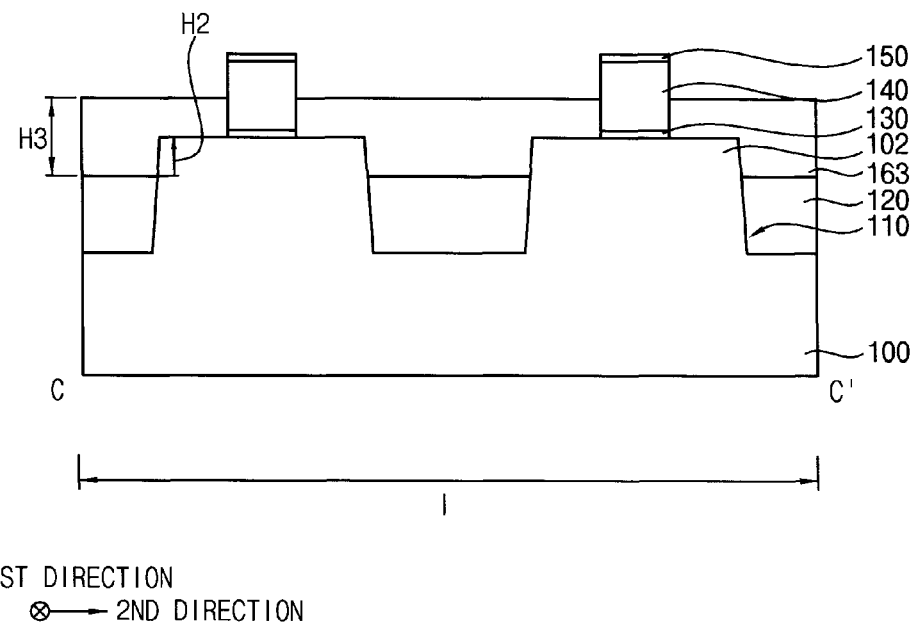
Figure 51:
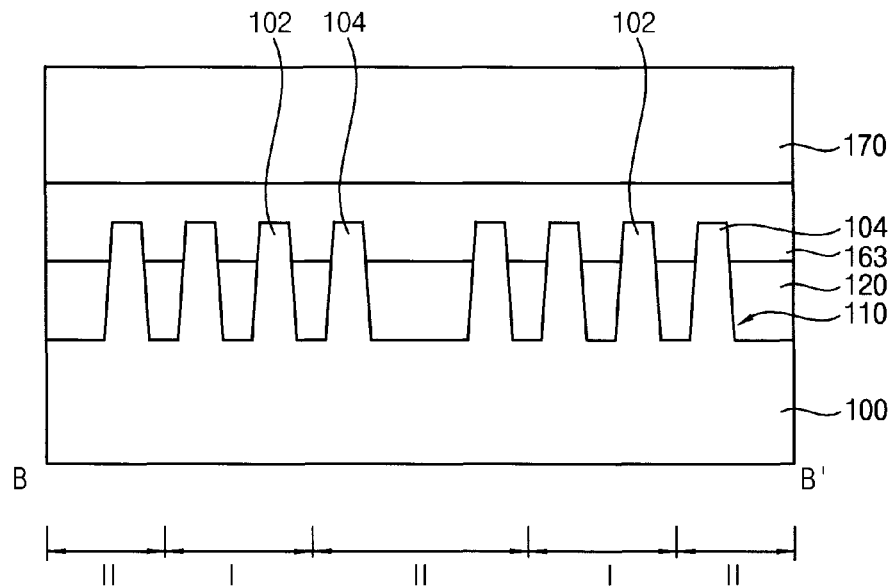
Figure 52:
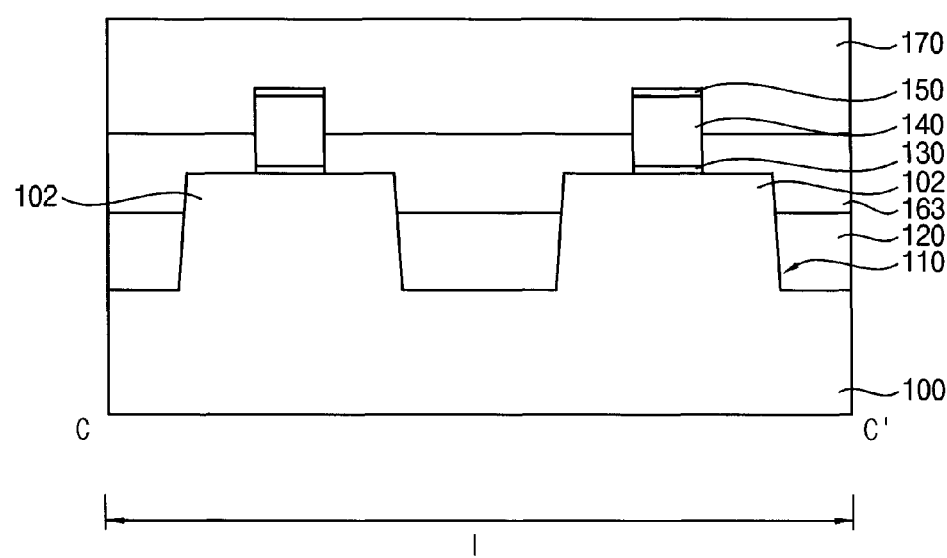
Figure 53:
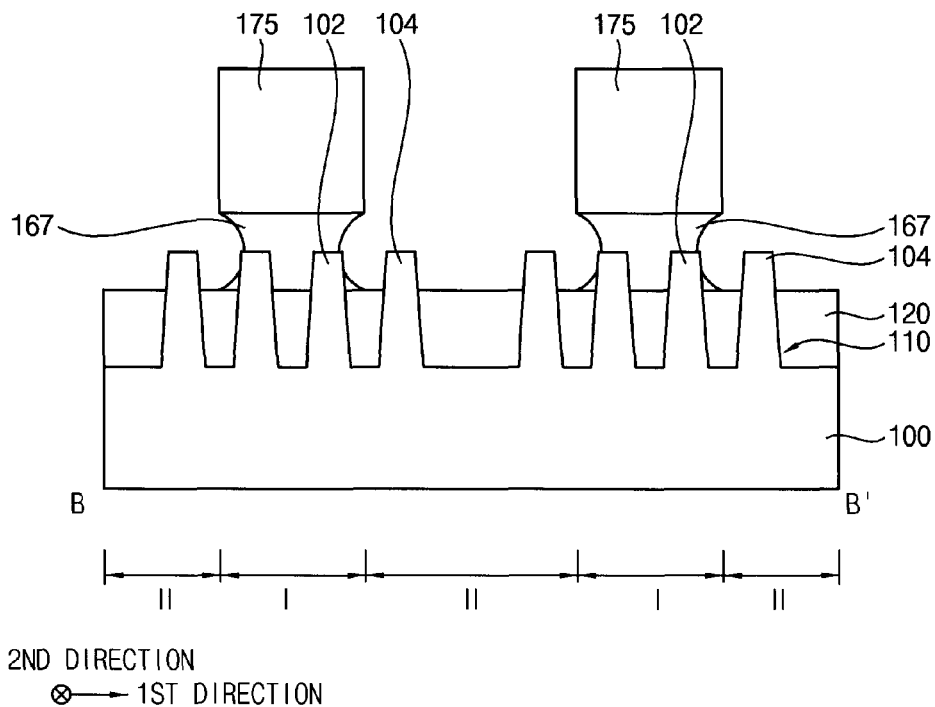
Figure 54:
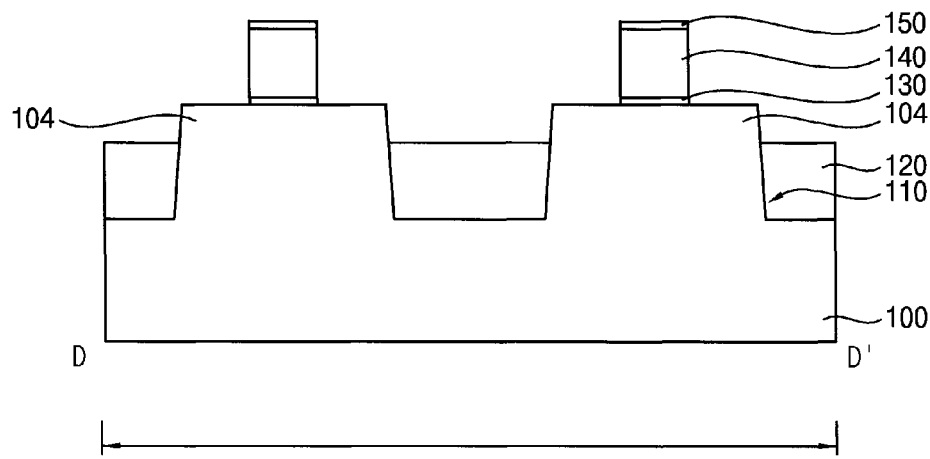

FIGS. 49 to 55 are plan views and cross-sectional views illustrating stages of a method of manufacturing a semiconductor device in accordance with Comparative Example. Particularly, FIGS. 49, 51, 53 and 55 are cross-sectional views taken along a line B-B' of corresponding plan views, FIGS. 50 and 52 are cross-sectional views taken along a line C-C' of corresponding plan views, and FIG. 54 is a cross-sectional view taken along a line D-D' of a corresponding plan view.

Figure 3:
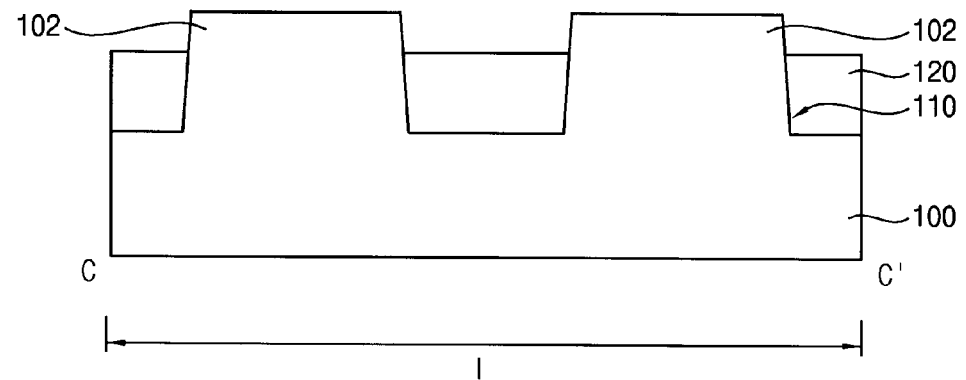
Figure 4:
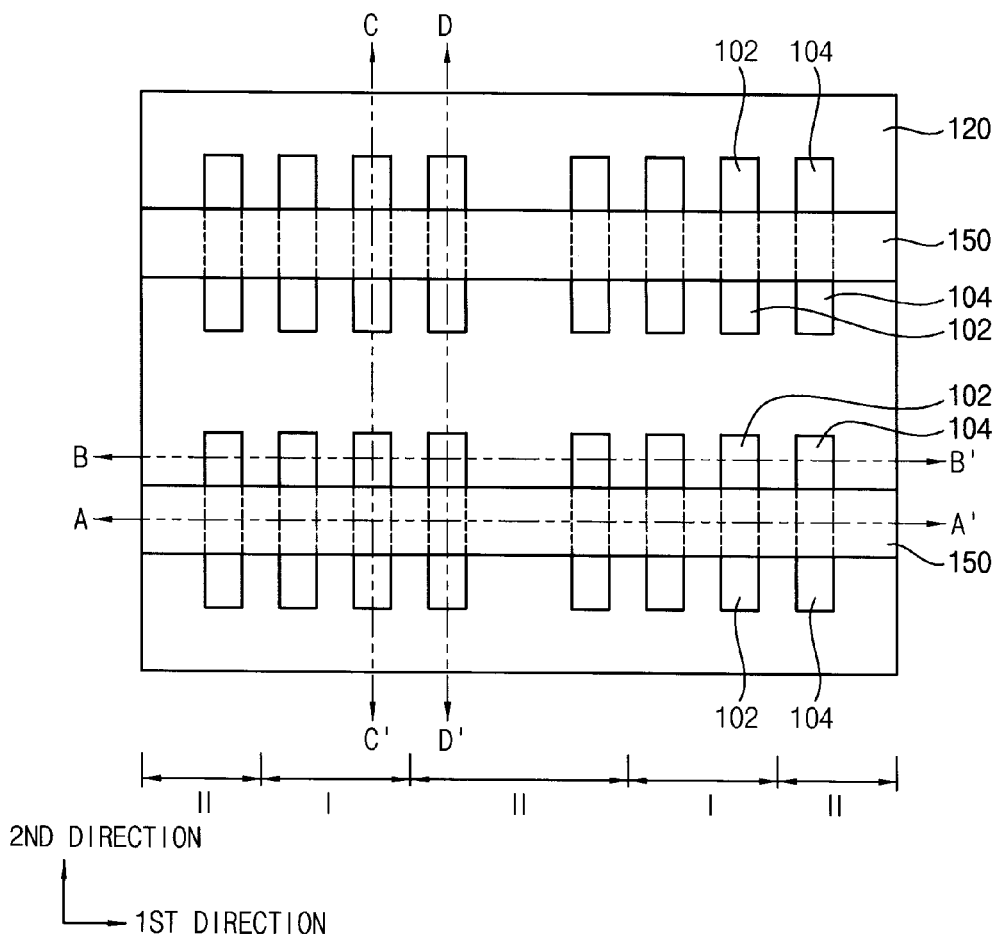
Figure 5:
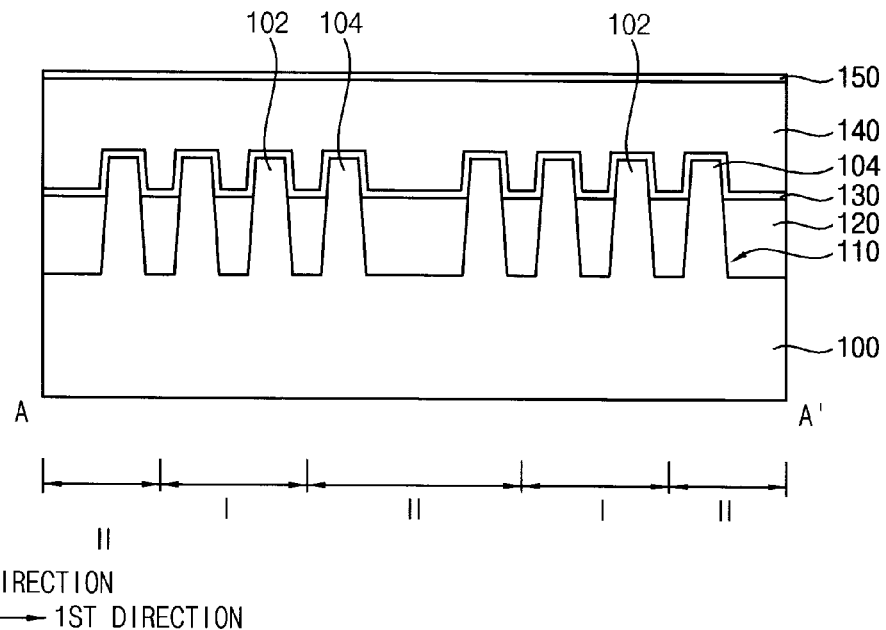
Figure 6:
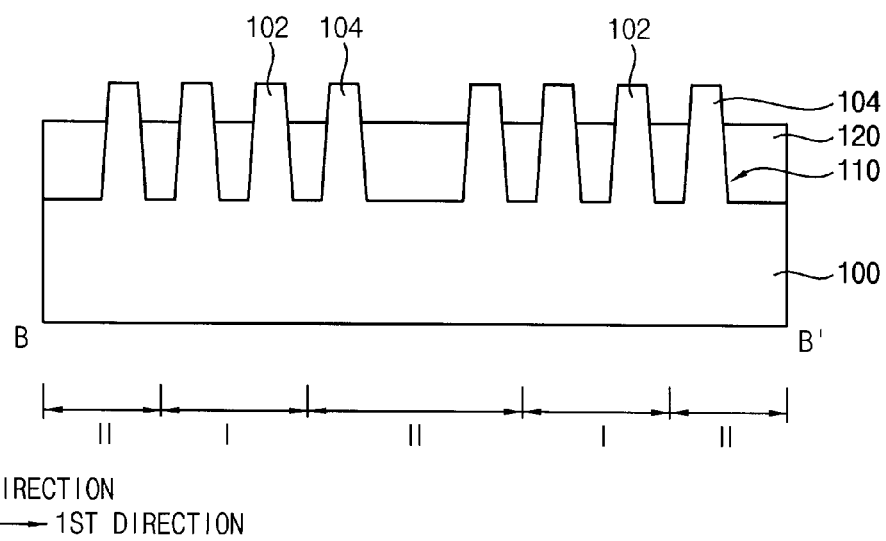
Figure 7:
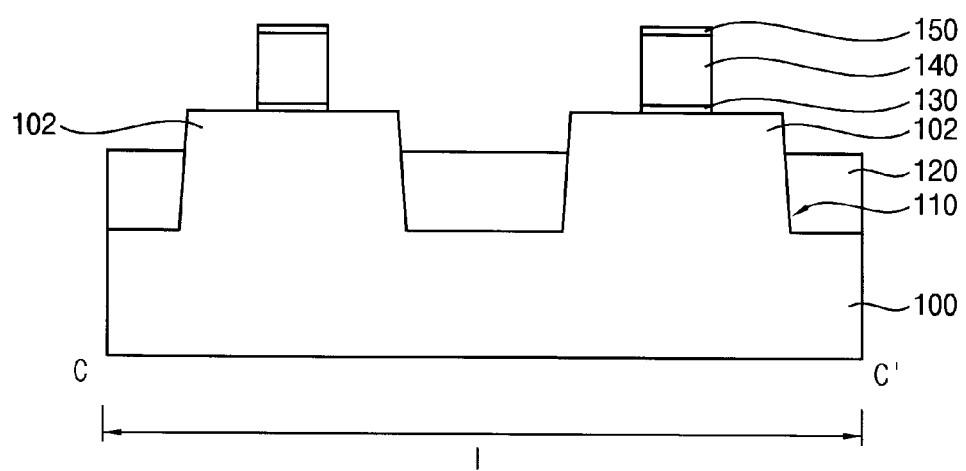
Figure 8:
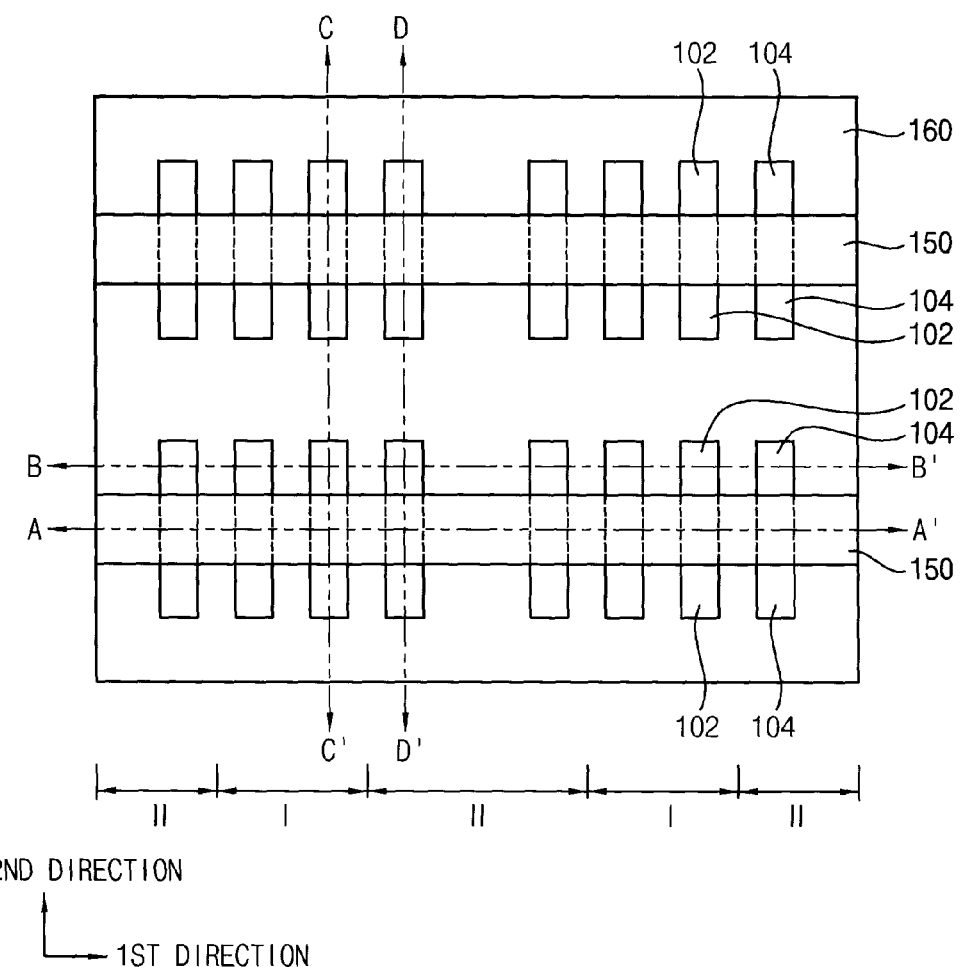
Figure 9:
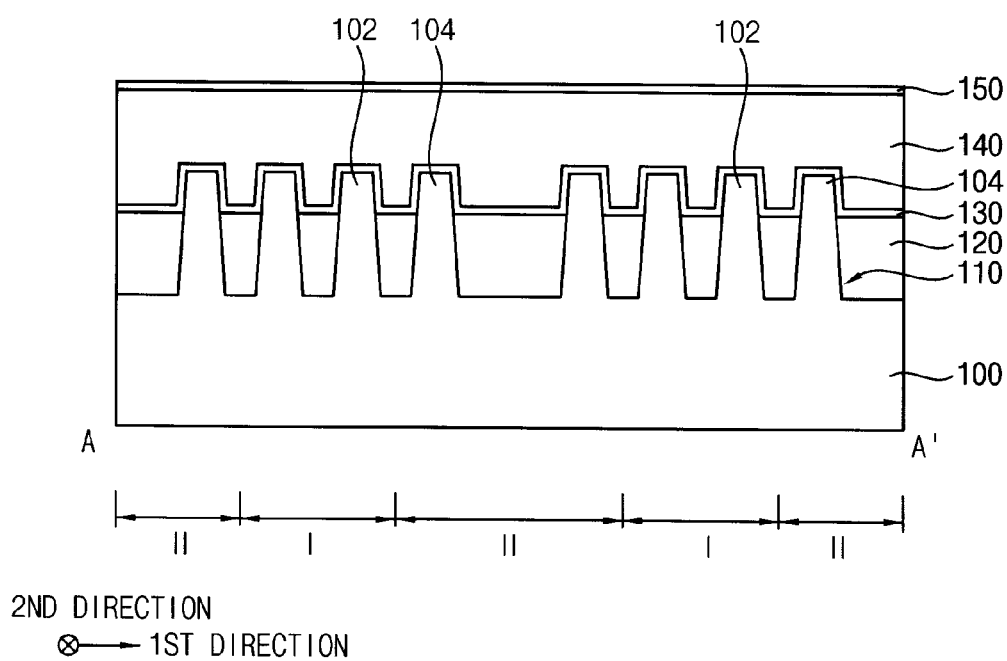

Referring to FIGS. 1, 2A and 3, an upper portion of a substrate 100 may be partially removed to form a trench 110, and an isolation layer pattern 120 may be formed on the substrate 100 to fill the trench 110.

The substrate 100 may include a semiconductor material, e.g., silicon, germanium, etc., or III-V compound semiconductor materials, e.g., GaP, GaAs, GaSb, etc. In some embodiments, the substrate 100 may be a silicon-on-insulator (SOI) substrate or a germanium-on-insulator (GOI) substrate.

The substrate 100 may include a first region I and a second region II. In example embodiments, the first region I may be a positive-channel metal oxide semiconductor (PMOS) region in which PMOS transistors may be formed, and the second region II may be a negative-channel metal oxide semiconductor (NMOS) region in which NMOS transistors may be formed. FIG. 1 shows that the first and second regions I and II are alternately and repeatedly formed in a first direction substantially parallel to a top surface of the substrate 100, however, the first and second regions I and II may be disposed in other layouts.

In example embodiments, the isolation layer pattern 120 may be formed by forming an isolation layer on the substrate 100 to sufficiently fill the trench 110, planarizing the isolation layer until a top surface of the substrate 100 may be exposed, and removing an upper portion of the planarized isolation layer to expose an upper portion of the trench 110. The isolation layer may be formed to include an oxide, e.g., silicon oxide. In example embodiments, the planarization process may be performed by a chemical mechanical polishing (CMP) process and/or an etch back process.

According as the isolation layer pattern 120 is formed, a field region of which a top surface may be covered by the isolation layer pattern 120 and an active region of which a top surface may not be covered by the isolation layer pattern 120 may be defined in the substrate 100. The active region may protrude from the isolation layer pattern 120 and have a fin-like shape so as to be referred to as an active fin.

Figure 2B:
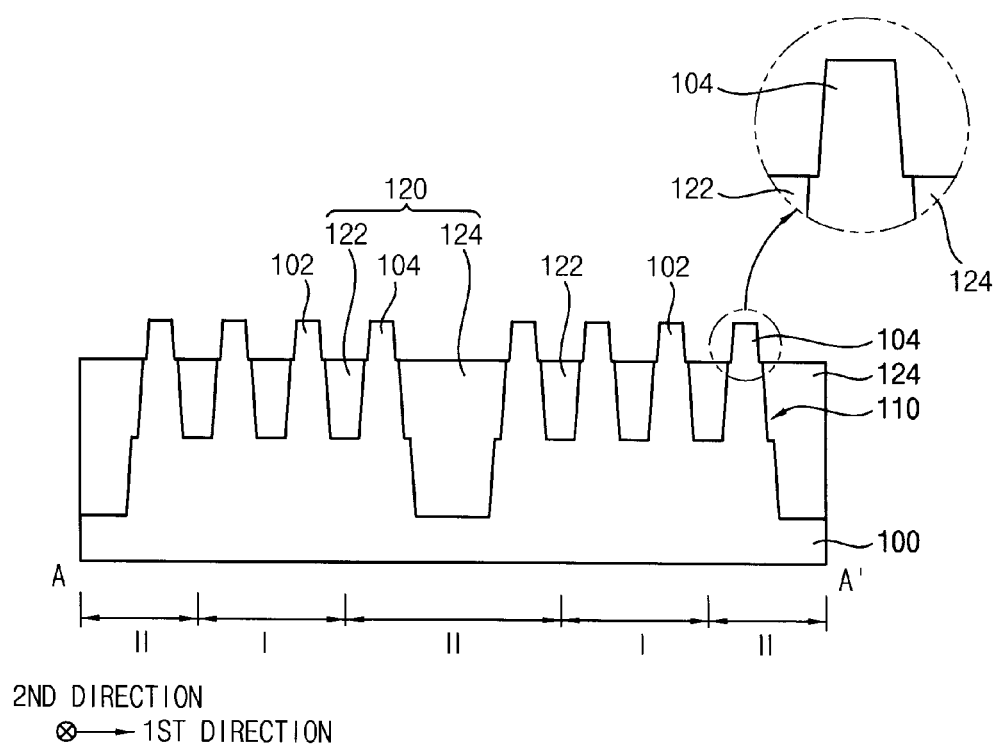

Referring to FIG. 2B, when the upper portion of the planarized isolation layer is removed, an upper portion of the substrate 100 may be partially removed also to have a reduced width. Thus, the active fin may be formed to include a lower portion of which a sidewall may be covered by the isolation layer pattern 120 and an upper portion protruding from the isolation layer pattern 120 of which a sidewall may not be covered by the isolation layer pattern 120, and the lower portion of the active fin may have a width greater than that of the upper portion thereof.

The isolation layer pattern 120 may be divided into a first isolation layer pattern 122 having a relatively small width and a second isolation layer pattern 124 having a relatively large width, and the second isolation layer pattern 124 may have a depth greater than that of the first isolation layer pattern 122.

Hereinafter, for the convenience of explanations, only the active fin and the isolation layer pattern 120 shown in FIG. 2A will be illustrated.

In example embodiments, a plurality of active regions may be formed in a second direction that may be substantially parallel to the top surface of the substrate 100 and substantially perpendicular to the first direction. Thus, the plurality of active regions may be formed in each of the first and second regions I and II. Hereinafter, the active regions formed in the first region I may be referred to as first active regions 102 or first active fins, and the active regions formed in the second region II may be referred to as second active regions 104 or second active fins.

Referring to FIGS. 4 to 7, a dummy gate structure may be formed on the substrate 100 and the isolation layer pattern 120.

The dummy gate structure may be formed by sequentially stacking a dummy gate insulation layer, a dummy gate electrode layer and a gate mask layer on the first and second active regions 102 and 104 of the substrate 100 and the isolation layer pattern 120, patterning the gate mask layer by a photolithography process using a photoresist pattern (not shown) to form a gate mask 150, and sequentially etching the dummy gate electrode layer and the dummy gate insulation layer using the gate mask 150 as an etching mask. Thus, the dummy gate structure may be formed to include a dummy gate insulation layer pattern 130, a dummy gate electrode 140 and the gate mask 150 sequentially stacked on the substrate 100 and the isolation layer pattern 120.

The dummy gate insulation layer may be formed to include an oxide, e.g., silicon oxide, the dummy gate electrode layer may be formed to include, e.g., polysilicon, and the gate mask layer may be formed to include a nitride, e.g., silicon nitride. The dummy gate insulation layer, the dummy gate electrode layer and the gate mask layer may be formed by a chemical vapor deposition (CVD) process, an atomic layer deposition (ALD) process, or the like. Alternatively, the dummy gate insulation layer may be formed by a thermal oxidation process on an upper portion of the substrate 100. The dummy gate electrode layer and the gate mask layer may be also formed by a CVD process, an ALD process, etc.

In example embodiments, the dummy gate structure may be formed to extend in the first direction on the first and second active regions 102 and 104 of the substrate 100 and the isolation layer pattern 120, and a plurality of dummy gate structures may be formed in the second direction. One or a plurality of dummy gate structures may be formed in each of the first and second active regions 102 and 104, and FIGS. 4 to 7 show that only one dummy gate structure is formed in each of the first and second active regions 102 and 104. The present inventive concepts may not be limited thereto, however, for the convenience of explanations, only one dummy gate structure in each of the first and second active regions 102 and 104 will be illustrated hereinafter.

Alternatively, the dummy gate structure may not be formed on the isolation layer pattern 120 but only on the first and second active regions 102 and 104.

The dummy gate structure may have a width in the second direction less than those of the first and second active regions 102 and 104. In example embodiments, the dummy gate structure may be formed to cover a central portion in the second direction of each of the first and second active regions 102 and 104, and thus peripheral portions of each of the first and second active regions 102 and 104 may not be covered by the dummy gate structure.

Referring to FIGS. 8, 9, 10A and 11A, a first anti-reflective coating (ARC) layer 160 may be formed on the isolation layer pattern 120 to at least partially cover sidewalls of the first and second active regions 102 and 104.

In example embodiments, the first ARC layer 160 may be formed by spin coating an anti-reflective composition to form a preliminary first ARC layer, and baking the preliminary first ARC layer.

In example embodiments, the spin coating process may be performed under process conditions having good gap-fill characteristics, and thus the first ARC layer 160 may be formed only on the isolation layer pattern 120 to partially cover the sidewalls of the first and second active regions 102 and 104, and may not be formed on top surfaces of the first and second active regions 102 and 104 and the dummy gate structure. In an example embodiment, the baking process may be performed at a temperature of about 150° C. to about 300° C.

In example embodiments, the first ARC layer 160 may be a developable bottom anti-reflective coating (DBARC) layer. That is, when a first photoresist layer 170 (refer to FIGS. 12 to 15) subsequently formed is removed by a developing solution, the first ARC layer 160 may be also removed by the developing solution. Thus, the anti-reflective composition may include a material that may be removed by the developing solution, e.g., polymer. In an example embodiment, the anti-reflective composition may include a polymer containing chromophore group, a cross-linker that may be cross-linked with the polymer by reaction with acid, a photoacid generator (PAG), a thermal acid generator (TAG), and a solvent.

In example embodiments, a first height H1 from a top surface of the isolation layer pattern 120 to a top surface of the first ARC layer 160 may be equal to or greater than half of a second height H2 from the top surface of the isolation layer pattern 120 to top surfaces of the first and second active regions 102 and 104, and thus a reflection of light during a subsequent exposure process on the first photoresist layer 170 may be effectively reduced or prevented.

In example embodiments, the first height H1 of the top surface of the first ARC layer 160 may be equal to or less than the second height H2 of the top surfaces of the first and second active regions 102 and 104. Thus, the first ARC layer 160 may not cover the top surfaces of the first and second active regions 102 and 104, which may be exposed.

Figure 10A:
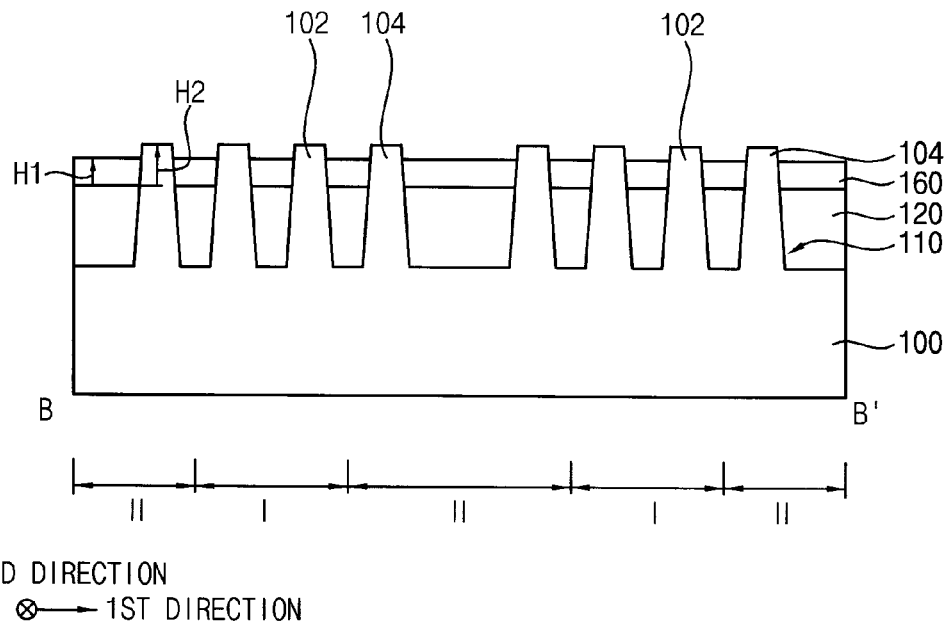
Figure 10B:
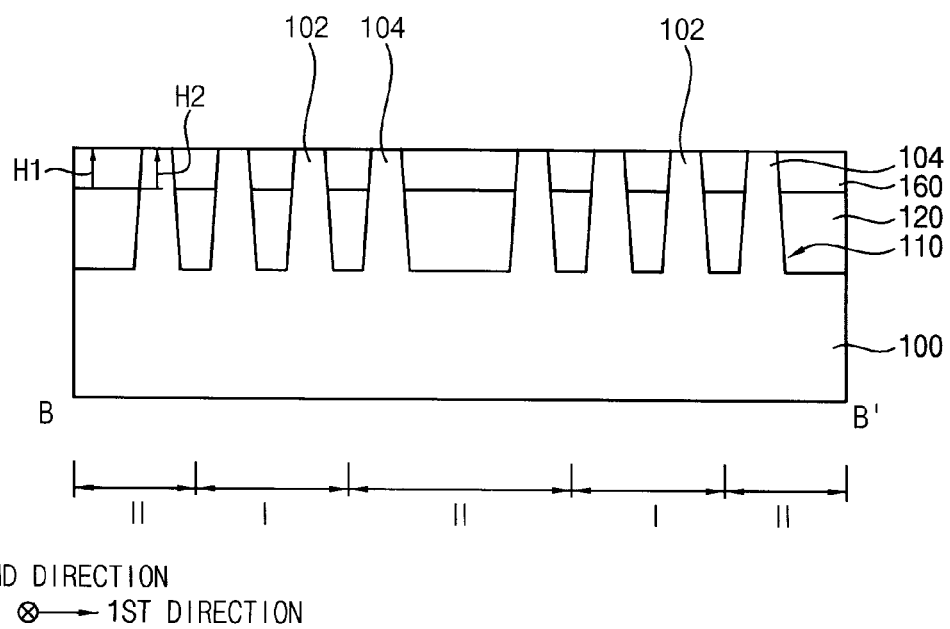
Figure 11A:
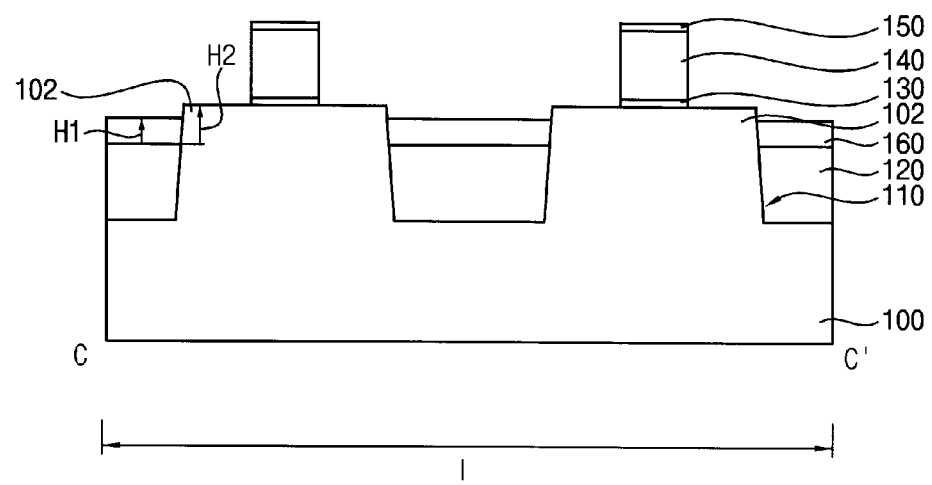
Figure 11B:
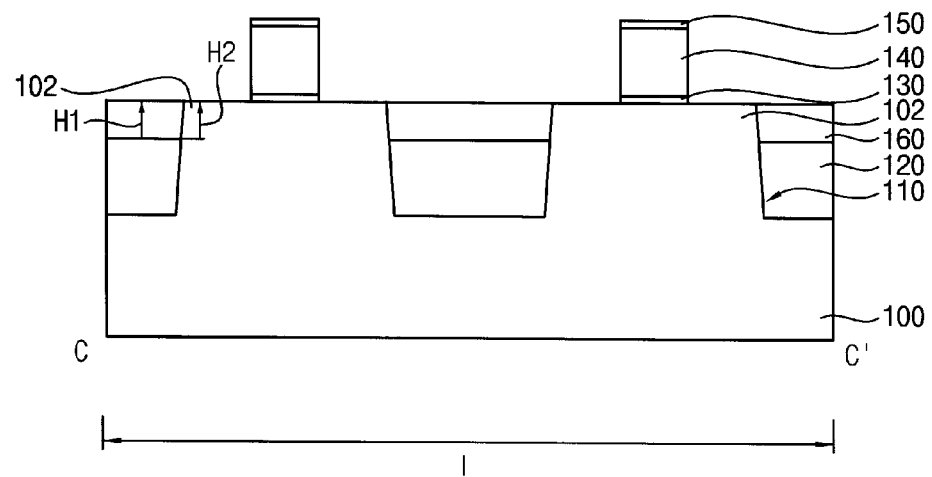

FIGS. 10A and 11A show that the first height H1 is less than the second height H2, and FIGS. 10B and 11B show that the first height H1 is substantially the same as the second height H2. In FIGS. 10A and 11A, the first ARC layer 160 may be formed on the isolation layer pattern 120 to cover only lower sidewalls of the first and second active regions 102 and 104, and in FIGS. 10B and 11B, the first ARC layer 160 may be formed on the isolation layer pattern 120 to cover the entire sidewalls of the first and second active regions 102 and 104.

Figure 10C:
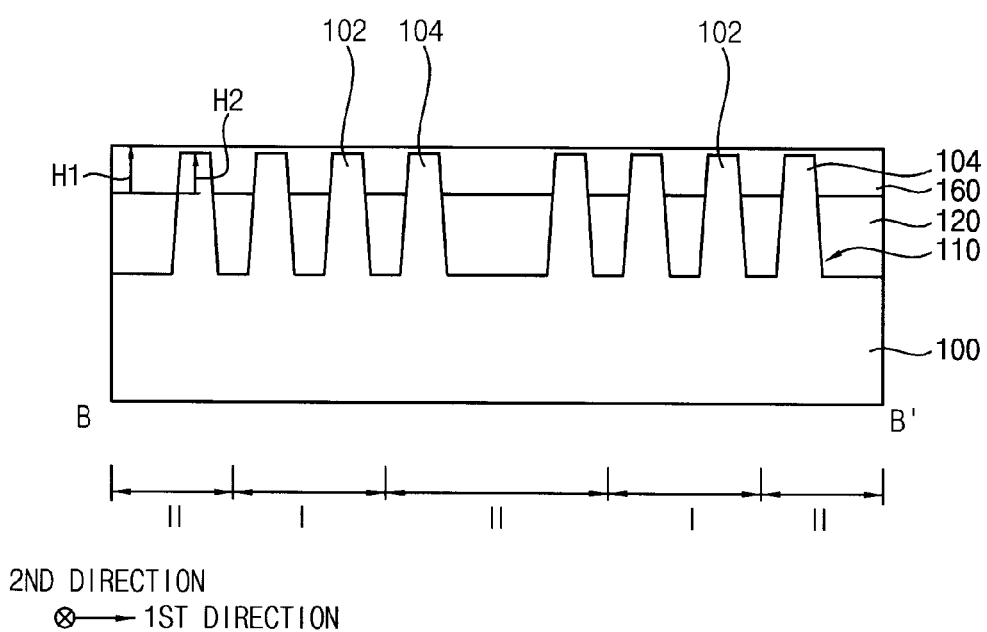
Figure 11C:
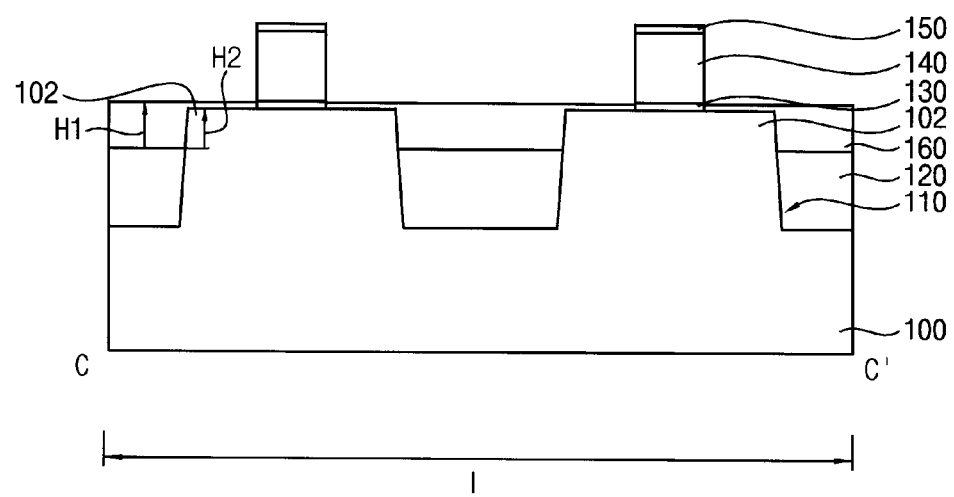
Figure 13:
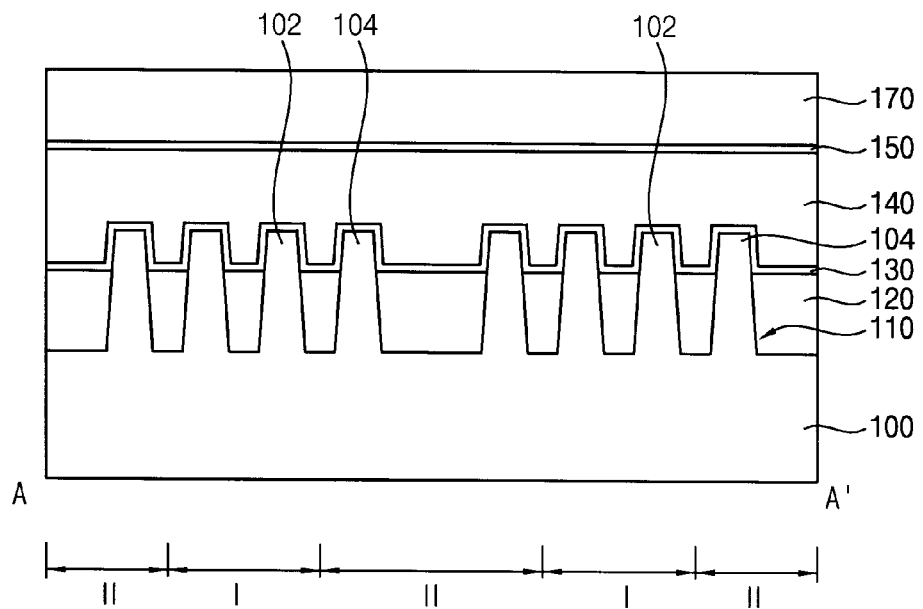
Figure 14:
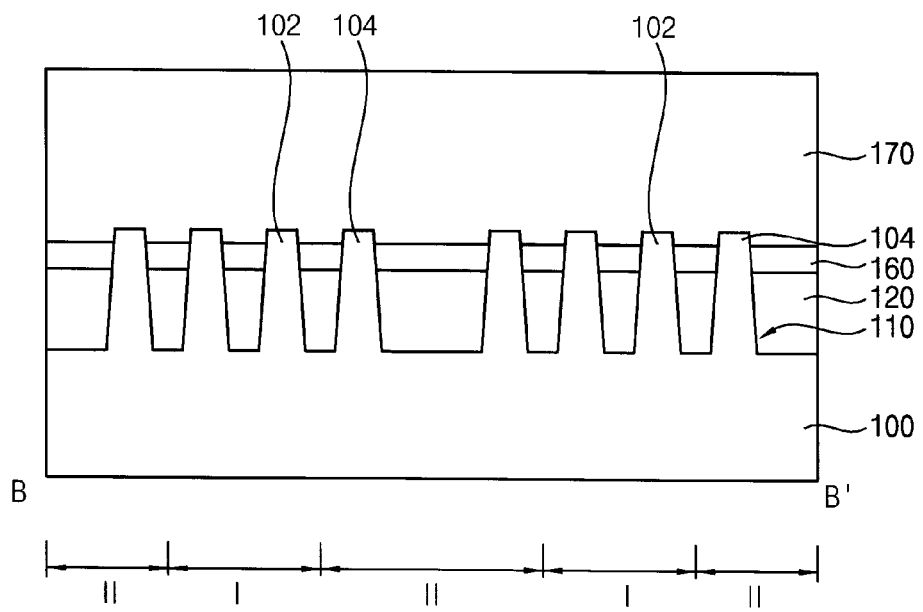
Figure 15:
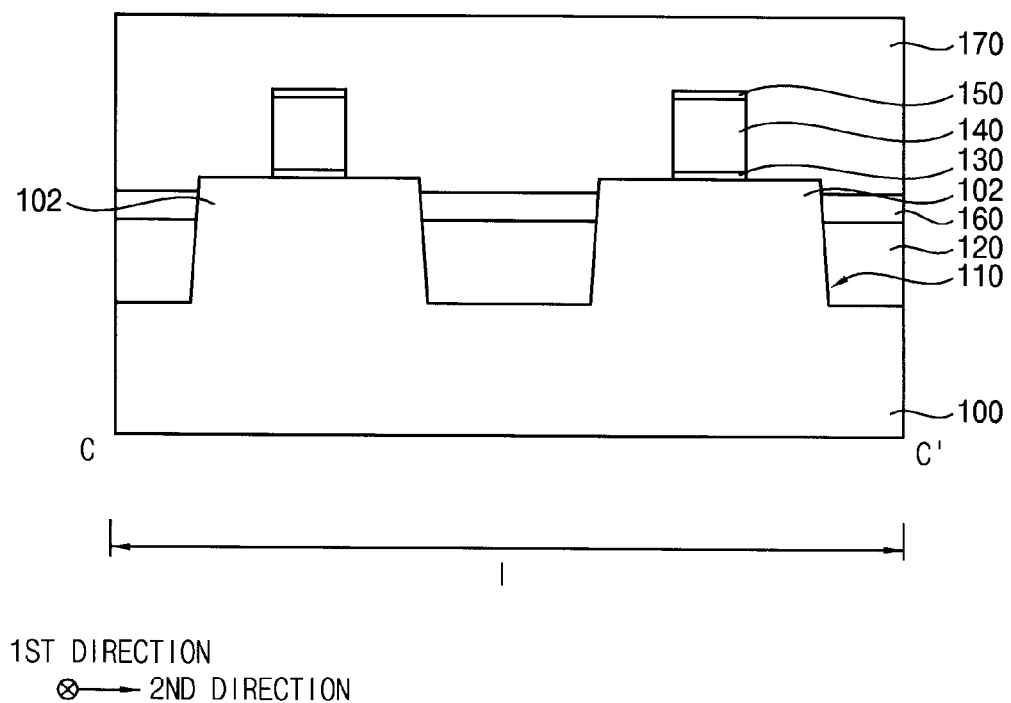
Figure 16:
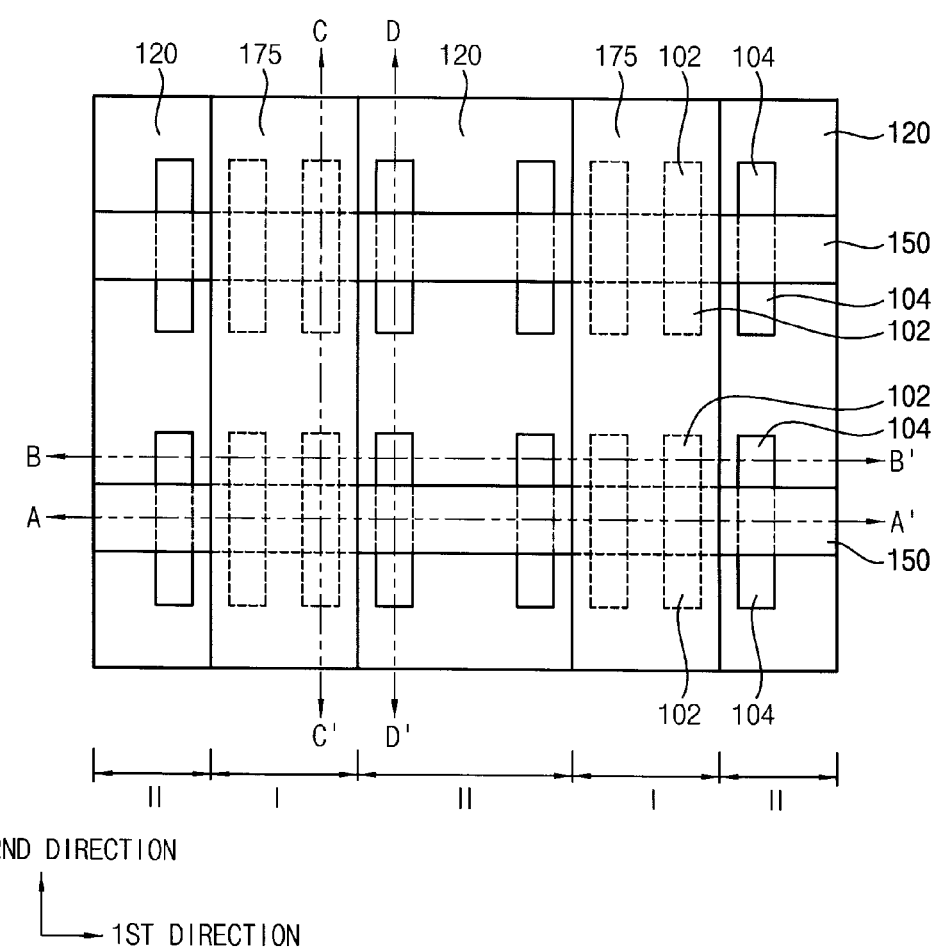
Figure 17:
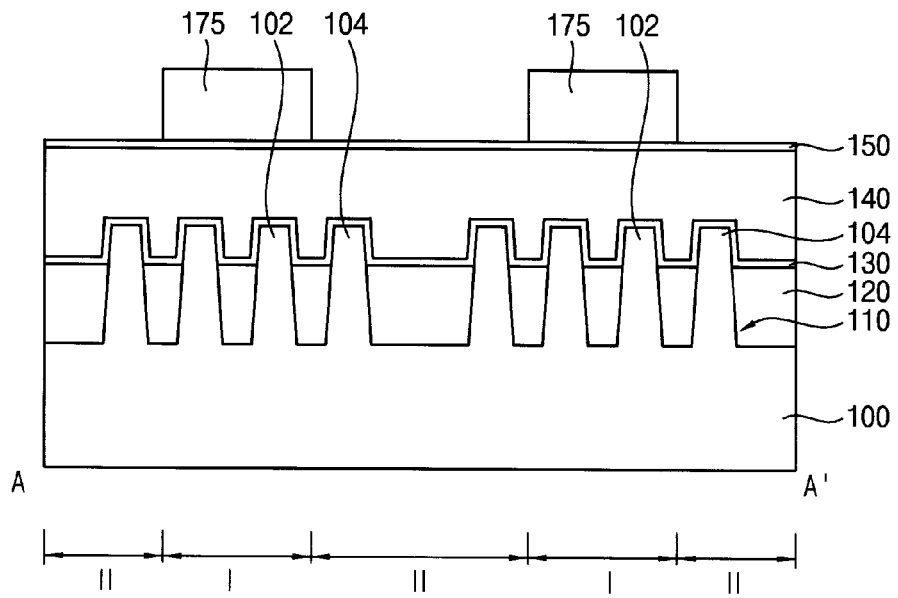
Figure 18:
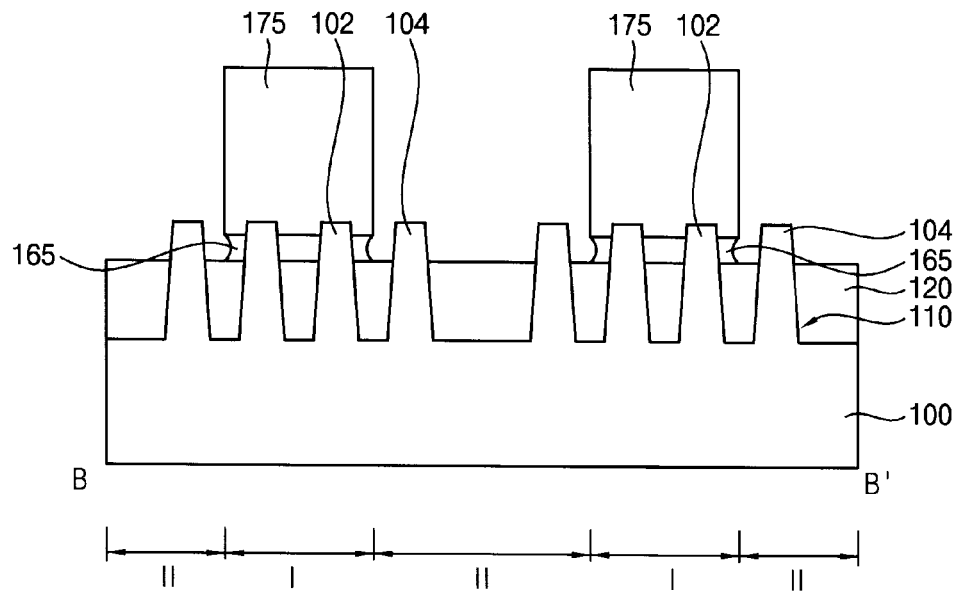
Figure 19:
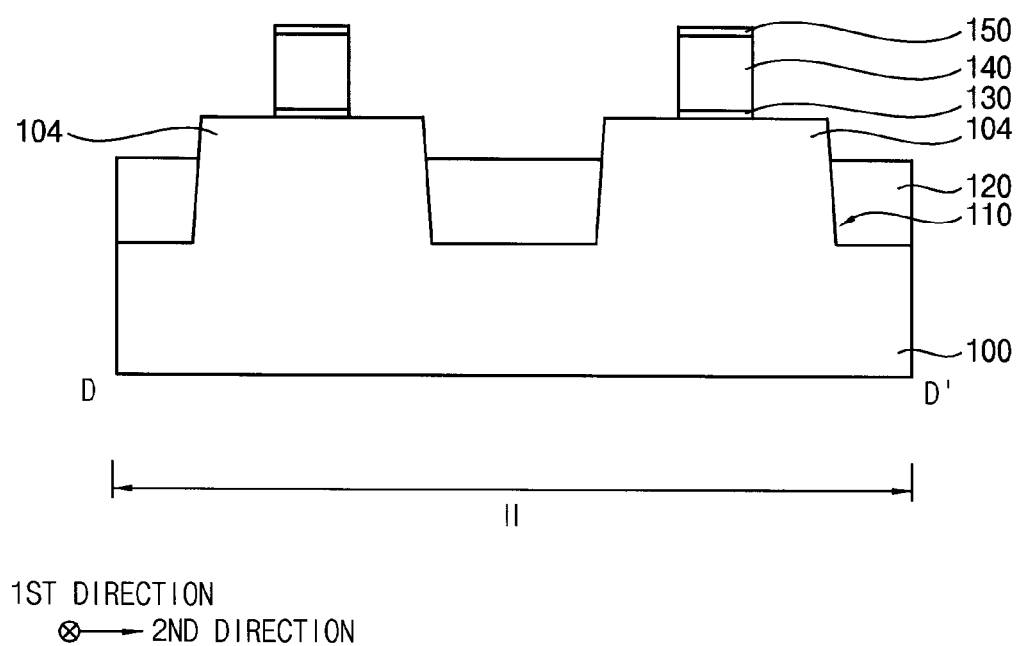
Figure 20:
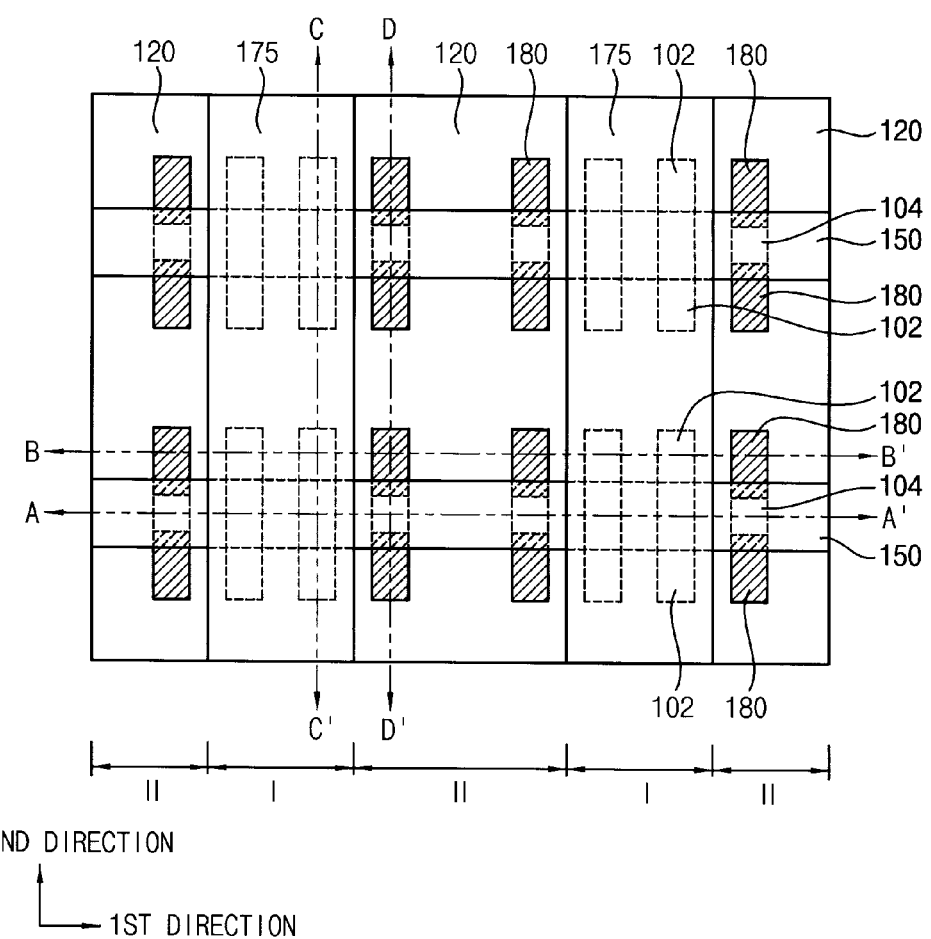
Figure 21:
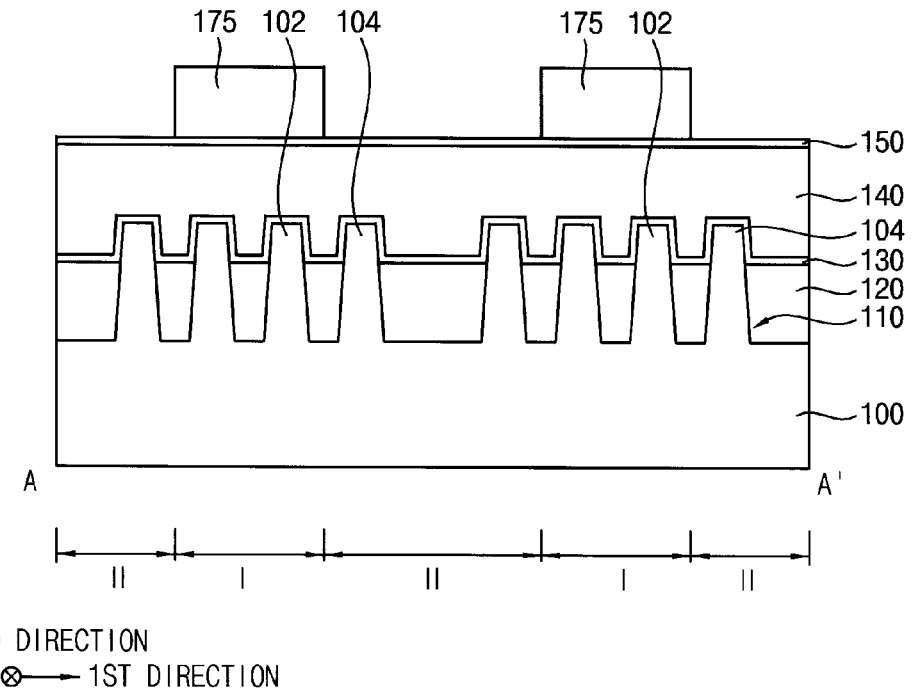
Figure 22:
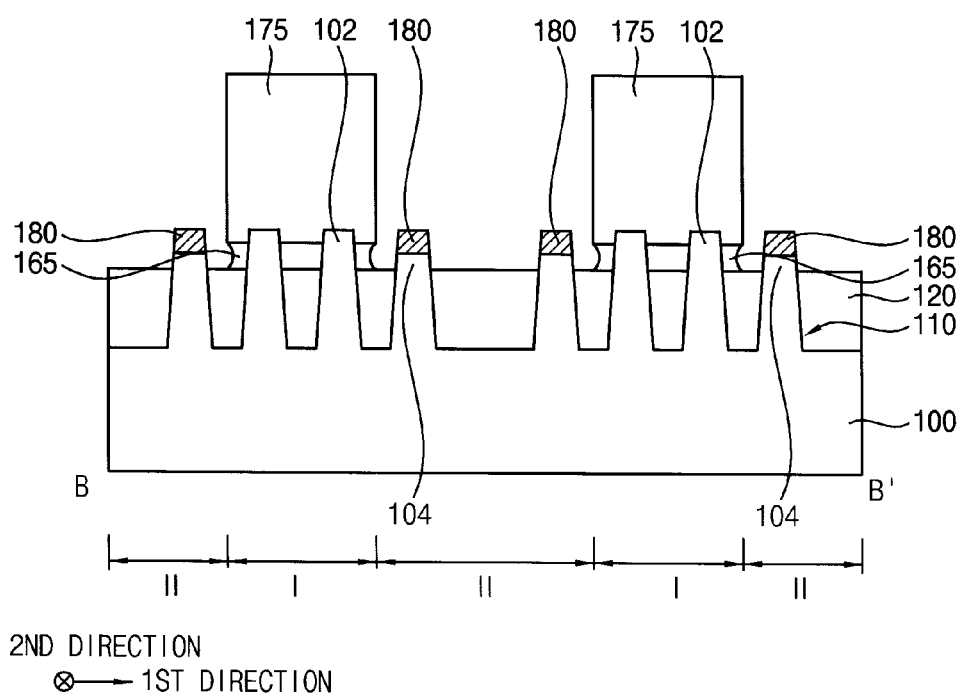
Figure 23:
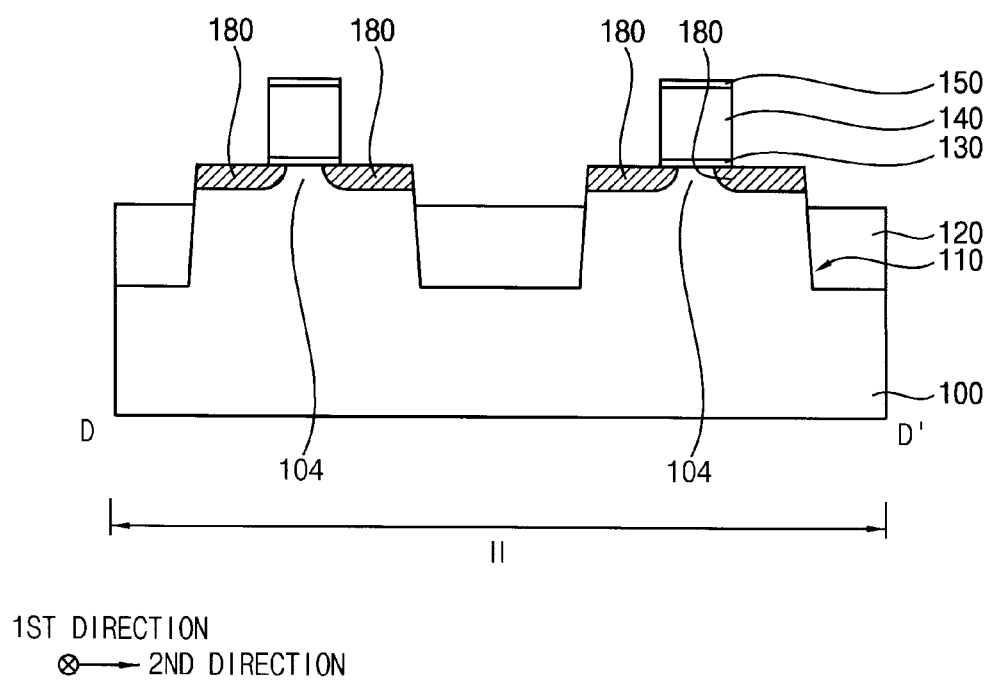
Figure 24:
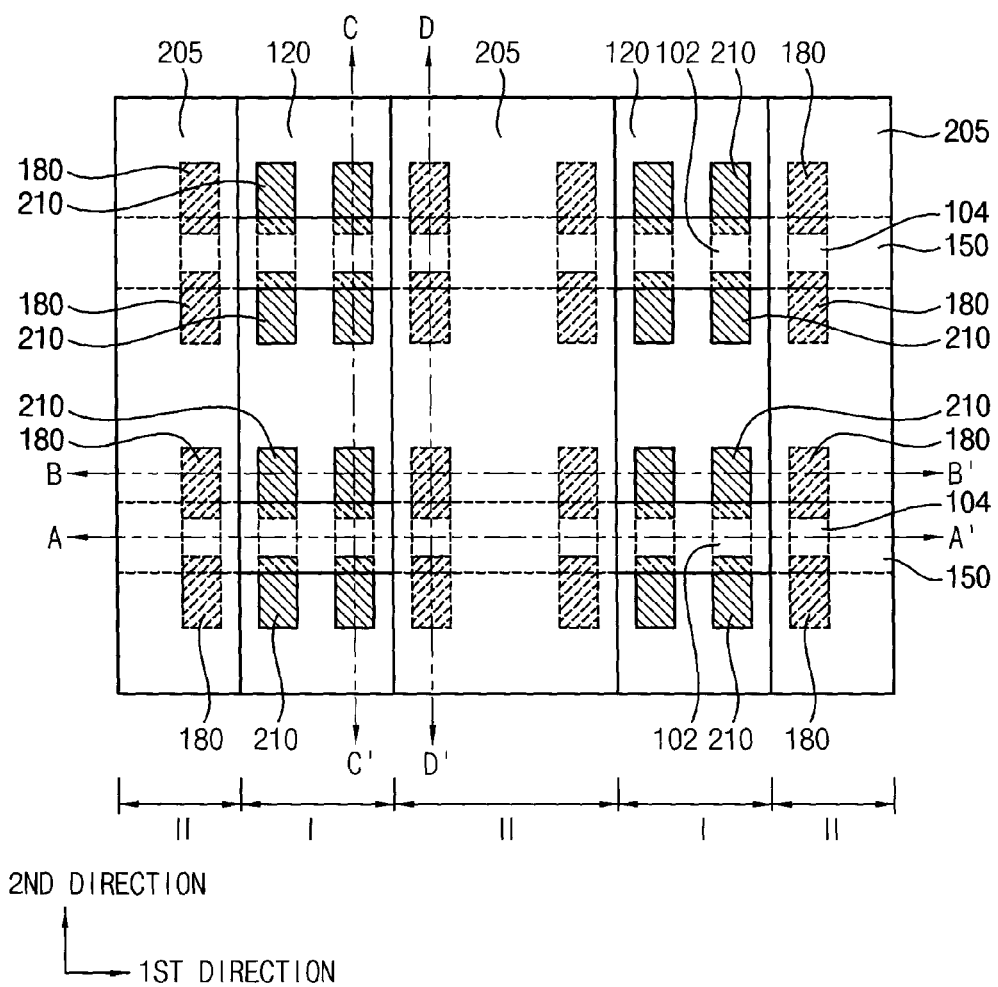
Figure 25:
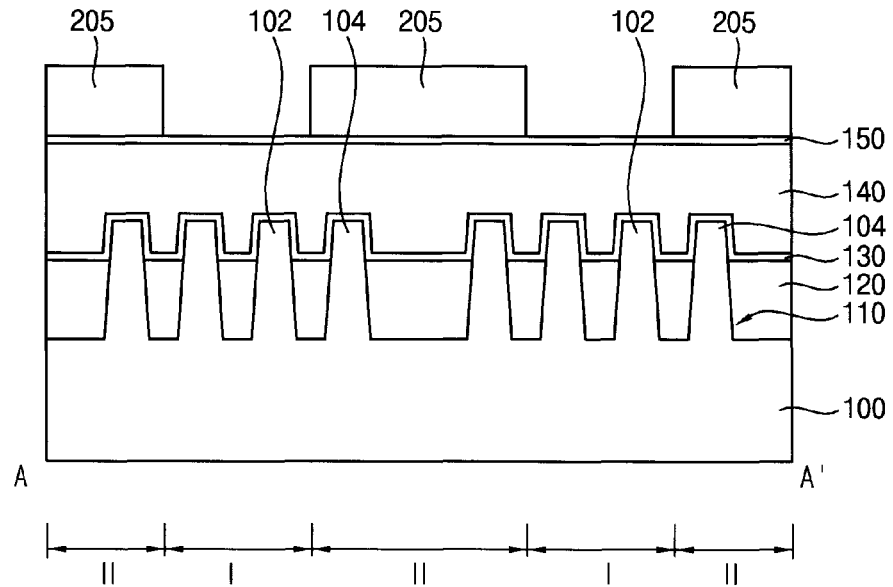
Figure 26:
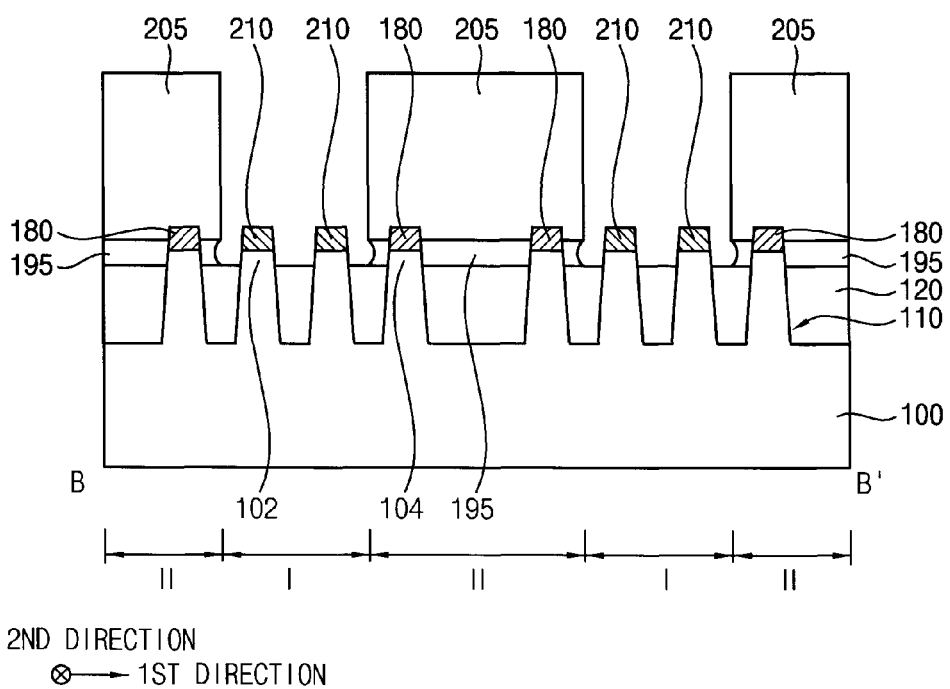
Figure 27:
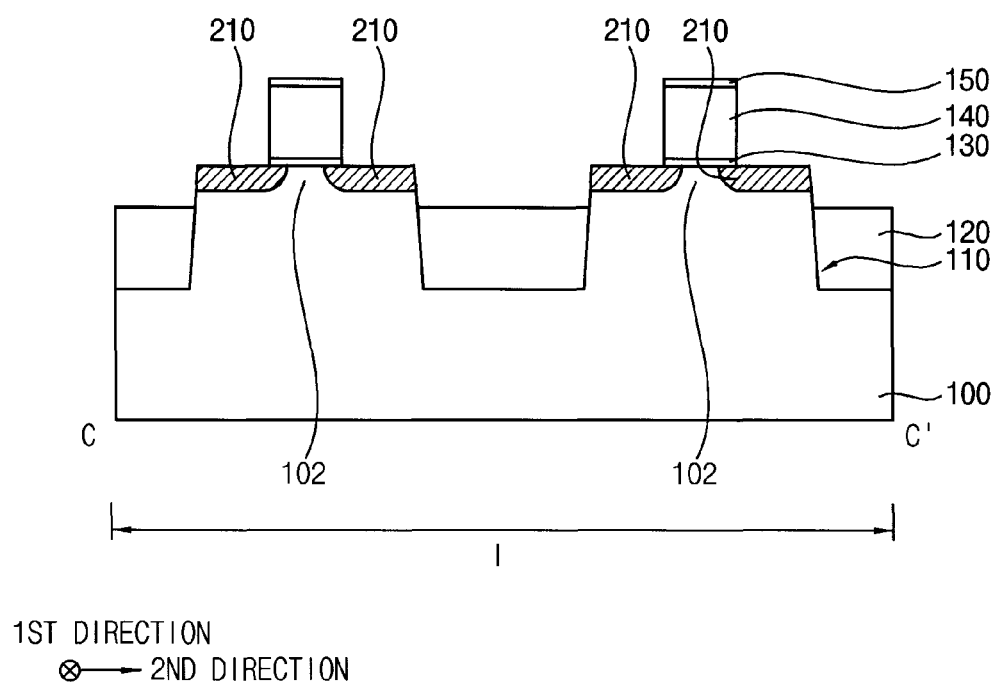

Referring to FIGS. 10C and 11C, the first height H1 may be slightly greater than the second height H2, and in this case, the first ARC layer 160 may cover not only the sidewalls of the first and second active regions 102 and 104 but also the top surfaces thereof very thinly. Hereinafter, for the convenience of explanations, only the first ARC layer 160 shown in FIGS. 10A and 11A will be illustrated.

Referring to FIGS. 12 to 15, the first photoresist layer 170 may be formed on the first ARC layer 160, the first and second active regions 102 and 104, and the dummy gate structure.

The first photoresist layer 170 may be formed to include e.g., acetal, acrylate, ESCAP, cyclo olefin-maleic anhydride copolymer (COMA), hybrid of COMA and acrylate, etc.

After forming the first photoresist layer 170, a baking process may be further performed at a temperature of about 70° C. to about 200° C.

Referring to FIGS. 16 to 19, the first photoresist layer 170 may be partially etched to form a photoresist pattern 175 covering the first region I and exposing the second region II. That is, the first photoresist pattern 175 may be formed on the first ARC layer 160, the first and second active regions 102 and 104, and the dummy gate structure to cover the first active regions 102 in the first region I and a portion of the isolation layer pattern 120 adjacent thereto. Thus, the first photoresist pattern 175 may overlap the first active regions 102, and may not overlap the second active regions 104.

In example embodiments, the first photoresist pattern 175 may be formed by an exposure process and a development process on the first photoresist layer 170.

In the exposure process, a light may be emitted onto an exposure mask (not shown) having a hole (not shown) on the first photoresist layer 170, and a light having passed through the hole may be incident on a portion of the first photoresist layer 170 to be reacted therewith. The light may include, e.g., KrF, ArF, extreme ultra violet (EUV), vacuum ultra violet (VUV), electron beam, X-ray, or ion beam. A baking process may be further performed on the first photoresist layer 170 onto which the light has been emitted at a temperature of about 70° C. to about 200° C.

When performing the exposure process, the first ARC layer 160 having the first height H1 equal to or greater than half of the second height H2 of the first and second active regions 102 and 104 is formed under the first photoresist layer 170 so as to reduce or prevent diffused reflection of light. Thus, a light may be exactly emitted onto a desired portion of the first photoresist layer 170.

In the development process, a portion of the first photoresist layer 170 reacted with the light may be solved using a developer to be removed. The developer may include, e.g., about 0.01 to about 5 weight percent tetra-methyl ammonium hydroxide (TMAH) solution.

In the development process, the first ARC layer 160 may be also partially removed together with the first photoresist layer 170, and thus a first ARC layer pattern 165 may be formed.

That is, the first ARC layer 160 may include a material that may be developed by the developing solution, and thus a portion of the first ARC layer 160 under a portion of the first photoresist layer 170 developed in the development process may be removed. The first ARC layer 160 may be isotropically etched by the developing solution to be removed, and thus a sidewall of the first ARC layer pattern 165 may not be vertical but curved.

However, the top surface of the first ARC layer 160 may have the first height H1 equal to or less than the second height H2 of the top surfaces of the first and second active regions 102 and 104, and thus, even when the first ARC layer 160 may be partially removed by the isotropical etching process, no sidewall of the first active regions 102 covered by the first ARC layer 160 may be exposed.

Regarding this matter, explanations will be provided with reference to FIGS. 49 to 55 illustrating stages of a method of manufacturing a semiconductor device in Comparative Example.

Referring to FIGS. 49 and 50, a first ARC layer 160 may be formed on the isolation layer pattern 120, however, a top surface of the first ARC layer 160 may have a third height H3 much greater than the second height H2 of the top surfaces of the first and second active regions 102 and 104. Thus, the first and second active regions 102 and 104 may be completely covered by the first ARC layer 160, and at least a portion of a sidewall of the dummy gate structure may be covered by the first ARC layer 160.

Referring to FIGS. 51 and 52, a first photoresist layer 170 may be formed on the first ARC layer 160 and the dummy gate structure. Thus, a portion of the sidewall of the dummy gate structure may be covered by the first photoresist layer 170.

Referring to FIGS. 53 and 54, the first photoresist layer 170 may be partially etched to form a first photoresist pattern 175 covering the first region I of the substrate 100 and exposing the second region II of the substrate 100.

That is, an exposure process and a development process may be performed on the first photoresist layer 170 to form the first photoresist pattern 175 overlapping the first active regions 102 and not overlapping the second regions 104. A portion of the first ARC layer 160 under a removed portion of the first photoresist layer 170 may be also removed to form a first ARC layer pattern 167, and thus the second active regions 104 may be exposed.

The first ARC layer 160 may be isotropically etched by the developing solution to be removed, and thus a sidewall of the first ARC layer pattern 165 may not be vertical but curved. The first ARC layer 160 may have the third height H3 much greater than the second height H2 of the first and second active regions 102 and 104, and thus sidewalls and top surfaces of the first active regions 102 may be partially exposed by the isotropical etching process.

However, referring to FIGS. 16 to 19 again, in the method of manufacturing the semiconductor device in accordance with example embodiments, the first ARC layer 160 may have the first height H1 equal to or less than the second height H2 of the first and second active regions 102 and 104, and thus, even though the first ARC layer 160 may be partially removed by the isotropcal etching process, the sidewalls of the first active regions 102 covered by the first ARC layer 160 may not be exposed.

That is, distances between the first and second active regions 102 and 104 may decrease due to the high integration degree of the semiconductor device, and thus when the first photoresist layer 170 is patterned to form the first photoresist pattern 175 overlapping the first active regions 102 but not overlapping the second active region 104, the first photoresist pattern 175 may not have a large width. Thus, the first ARC layer patterns 165 and 167 under the first photoresist pattern 175 may not have a large width to sufficiently cover the first active regions 102.

Accordingly, in the method of manufacturing the semiconductor device in accordance with Comparative Example, as the first ARC layer 160 may have the high height, it may be removed a lot by the isotropical etching process, and the first active regions 102 may not be completely covered by the first ARC layer pattern 167 but partially exposed. However, in accordance with example embodiments, as the first ARC layer 160 may have the low height, it may not be removed a lot by the isotropical etching process, and the first active regions 102 may be sufficiently covered by the first ARC layer pattern 165 not to be exposed.

Referring to FIGS. 20 to 23, a first ion implantation process may be performed using the first photoresist pattern 175, the first ARC layer pattern 165 and the dummy gate structure as an ion implantation mask to form a first impurity region 180 at upper portions of the second active regions 104 adjacent to the dummy gate structure.

The portion of the first ARC layer 160 on the top surfaces of the second active region 104 has been removed by the development process, and thus the first ion implantation process may be effectively performed.

In example embodiments, a slant ion implantation process may be performed so that the first ion implantation process 180 may be formed not only on a portion of the second active regions 104 not covered by the dummy gate structure but also on a portion of the second active regions 104 covered by the dummy gate structure. However, the first active regions 102 may be sufficiently covered by the first ARC layer pattern 165 and the first photoresist pattern 175, and thus no impurity region may be formed in the first active regions 102 when the slant ion implantation process is performed.

Figure 55:
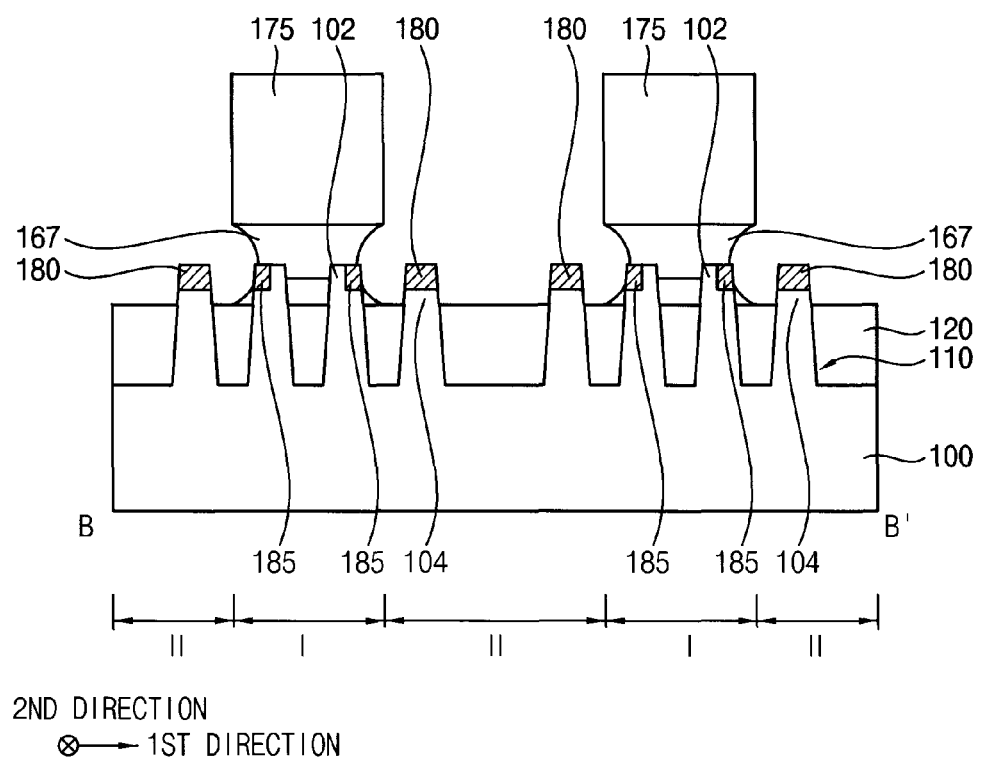

Referring to FIG. 55, in the method of manufacturing the semiconductor device in accordance with Comparative Example, the first ARC layer pattern 167 may not completely cover the first active regions 102 so that a portion of the active regions 102 may be exposed, and thus the first impurity region 180 may be formed in the first active regions 102 by the slant ion implantation process. Accordingly, the first impurity region 180 may be formed in an undesired portion so that the semiconductor device may not have desired electrical characteristics.

In example embodiments, the first impurity region 180 may be formed to include p-type impurities, e.g., boron, gallium, etc. The first impurity region 180 may be referred to as a first halo region.

The first photoresist pattern 175 may be removed by an ashing process and/or a stripping process, and the first ARC layer pattern 165 thereunder may be also removed.

Referring to FIGS. 24 to 27, processes substantially the same as or similar to those illustrated with reference to FIGS. 8 to 23 may be performed. However, a second impurity region 210 may be formed in the first active regions 102, while the first impurity region 180 may be formed in the second active regions 104.

That is, a second ARC layer may be formed on the isolation layer pattern 120 to at least partially cover the sidewalls of the first and second active regions 102 and 104. In example embodiments, the second ARC layer may be a DBARC layer. Thus, the second ARC layer may be formed to include a material that may be removed by a developing solution, e.g., a polymer.

In example embodiments, a top surface of the second ARC layer may be formed to have a height equal to or greater than half of the second height H2 of the top surfaces of the first and second active regions 102 and 104, and thus diffused reflection of light may be effectively reduced or prevented when an exposure process is subsequently performed on the second photoresist layer. In example embodiments, the height of the top surface of the second ARC layer may be equal to or less than the second height H2 of the top surfaces of the first and second active regions 102 and 104. Thus, the second ARC layer may not cover the top surfaces of the first and second active regions 102 and 104, which may be exposed.

Similar to the first ARC layer 160, in some embodiments, the second ARC layer may have a height slightly greater than the second height H2, and in this case, the second ARC layer may cover not only the sidewalls of the first and second active regions 102 and 104 but also the top surfaces of the first and second active regions 102 and 104 very thinly.

After forming a second photoresist layer on the second ARC layer, the first and second active regions 102 and 104 and the dummy gate structure, the second photoresist layer may be partially etched to form a second photoresist pattern 205 covering the second region II and exposing the first region I. That is, the second photoresist pattern 205 may be formed on the second ARC layer, the first and second active regions 102 and 104 and the dummy gate structure to cover the second active regions 104 in the second region II and a portion of the isolation layer pattern 120 adjacent thereto. Thus, the second photoresist pattern 205 may overlap the second active regions 104 and may not overlap the first active regions 102.

In example embodiments, the second photoresist pattern 205 may be formed by an exposure process and a development process on the second photoresist layer, and in the development process, the second ARC layer together with the second photoresist layer may be partially removed to form a second ARC layer pattern 195. The top surface of the second ARC layer may be equal to or less than the second height H2 of the top surfaces of the first and second active regions 102 and 104, and thus, even when the second ARC layer may be isotropically etched by a developing solution, the sidewalls of the second active regions 104 covered by the second ARC layer may not be exposed.

A second ion implantation process may be performed using the second photoresist pattern 205, the second ARC layer pattern 195 and the dummy gate structure as an ion implantation mask to form the second impurity region 210 at upper portions of the first active regions 102 of the substrate 100 adjacent to the dummy gate structure.

As the portion of the second ARC layer on the top surfaces of the first active regions 102 has been removed by the development process, the second ion implantation process may be effectively performed. In example embodiments, by performing a slant ion implantation process, the second impurity region 210 may be formed not only on a portion of the first active regions 102 not covered by the dummy gate structure but also on a portion of the first active regions 102 covered by the dummy gate structure. However, the second active regions 104 may be sufficiently covered by the second ARC layer pattern 195 and the second photoresist pattern 205, and thus no impurity region may be formed in the second active regions 104 when the slant ion implantation process is performed.

In example embodiments, the second impurity region 210 may be formed to include n-type impurities, e.g., phosphorus, arsenic, etc. The second impurity region 210 may be referred to as a second halo region.

The second photoresist pattern 205 may be removed by an ashing process and/or a stripping process, and the second ARC layer pattern 195 thereunder may be also removed.

Figure 28:
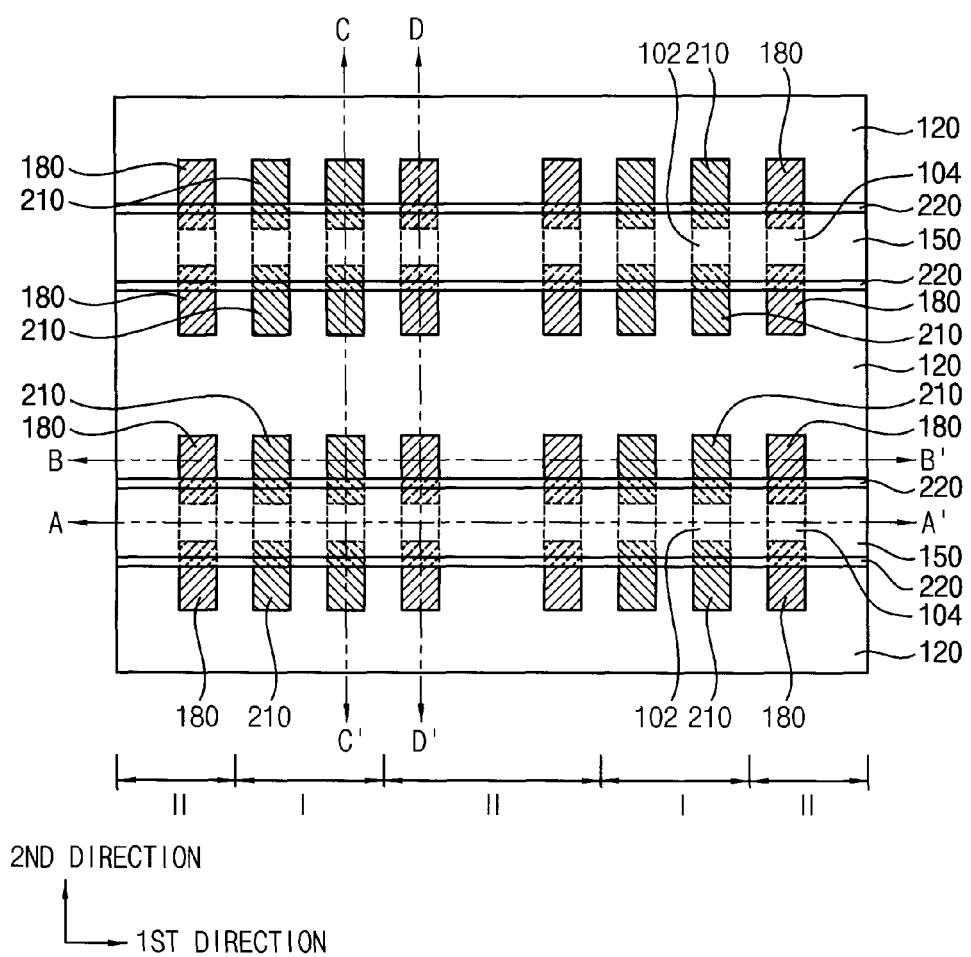
Figure 29:
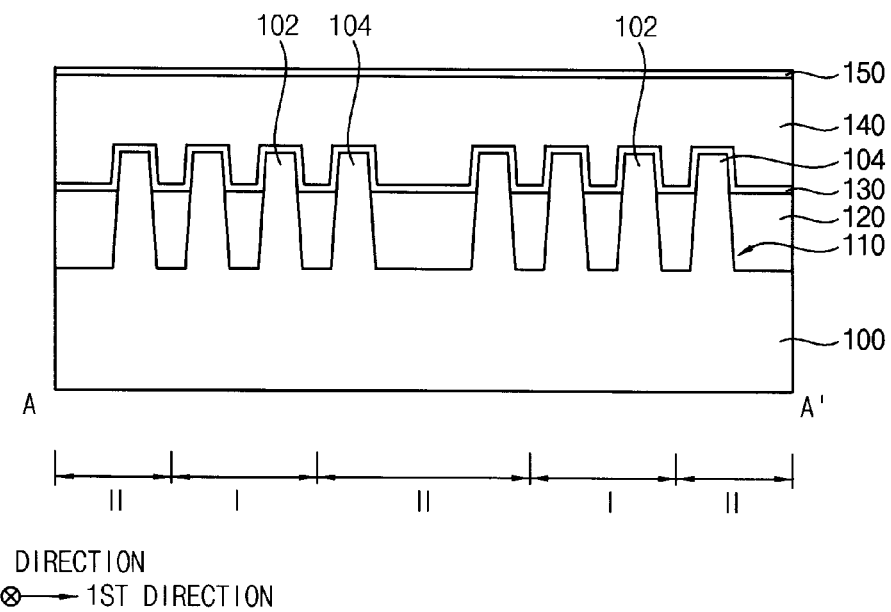
Figure 30:
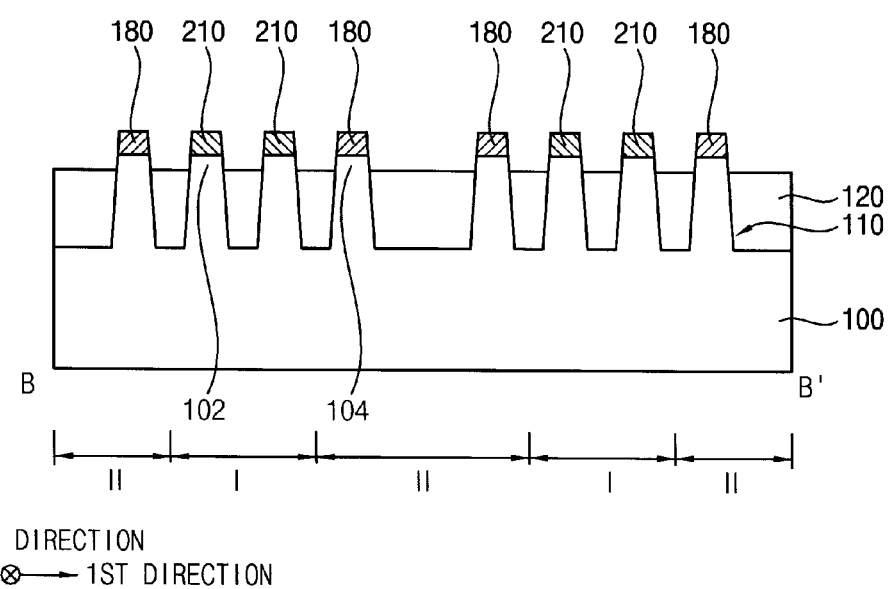
Figure 31:
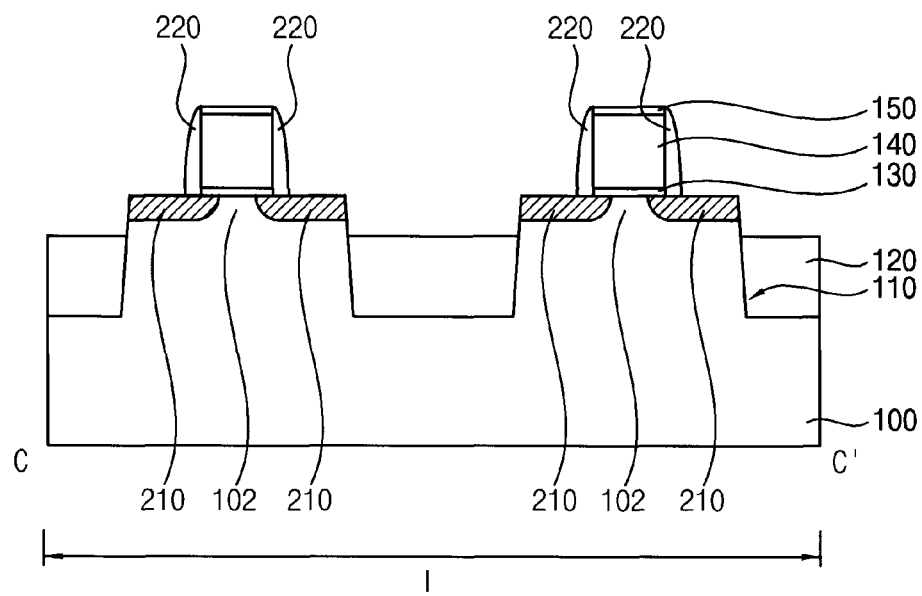
Figure 32:
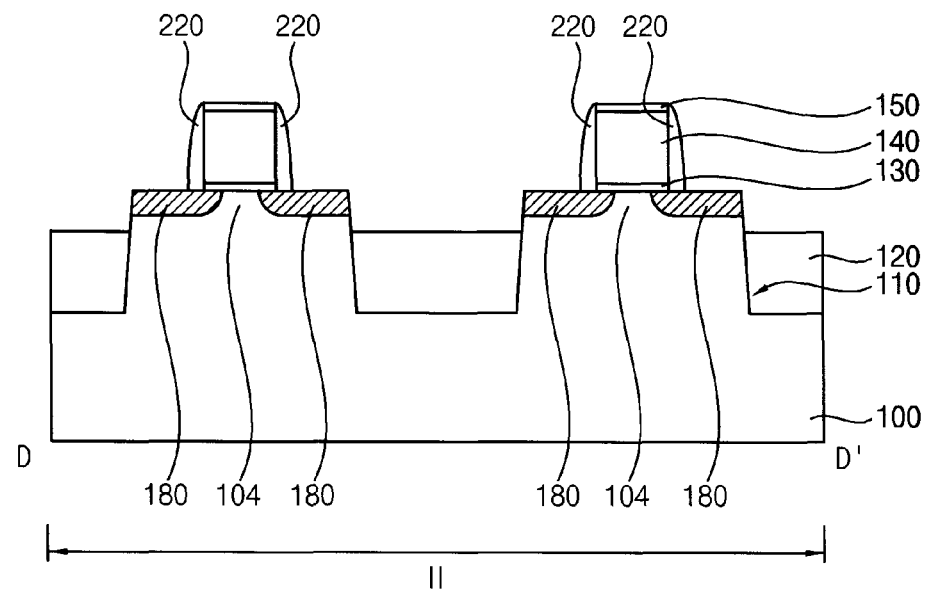
Figure 33:
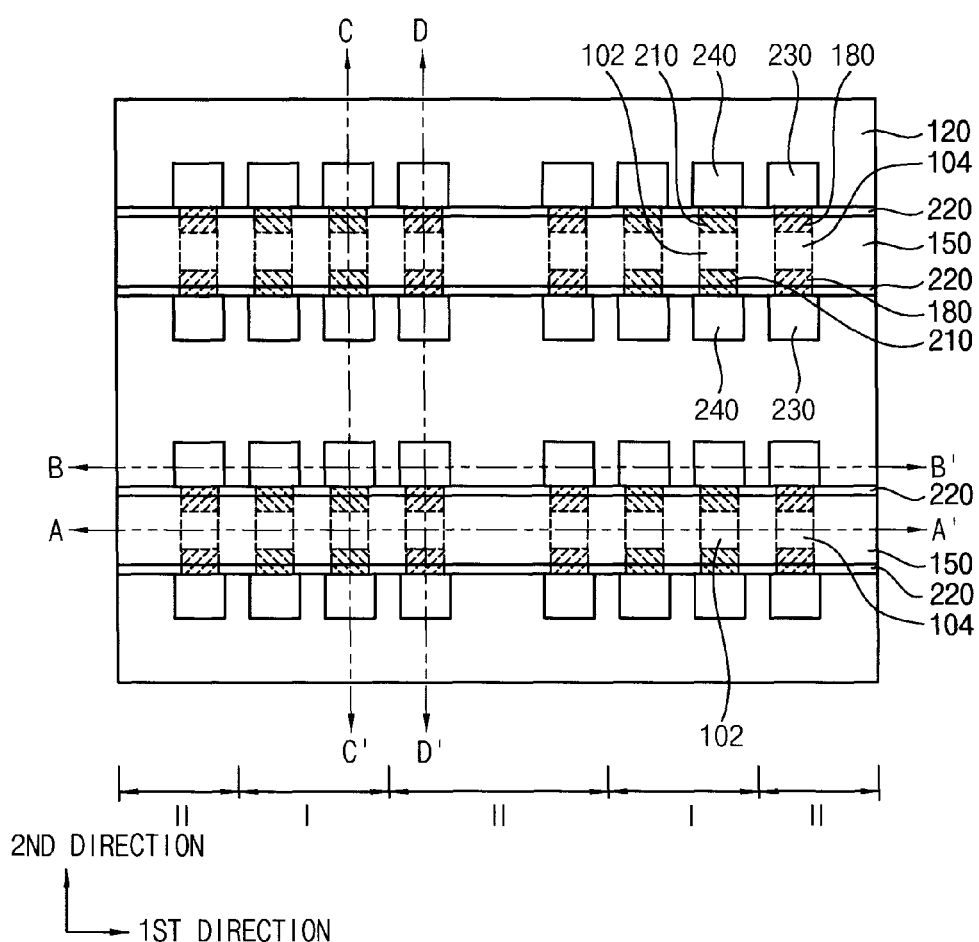
Figure 34:
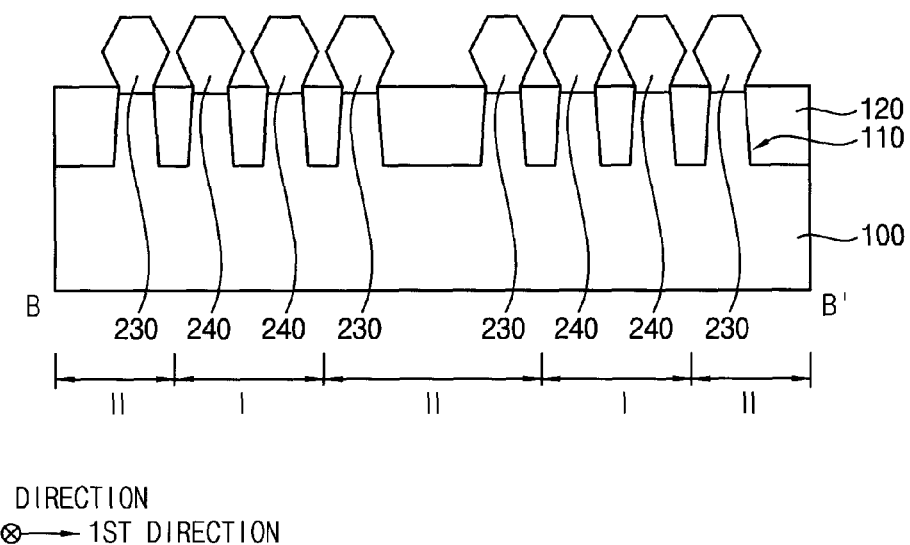
Figure 35:
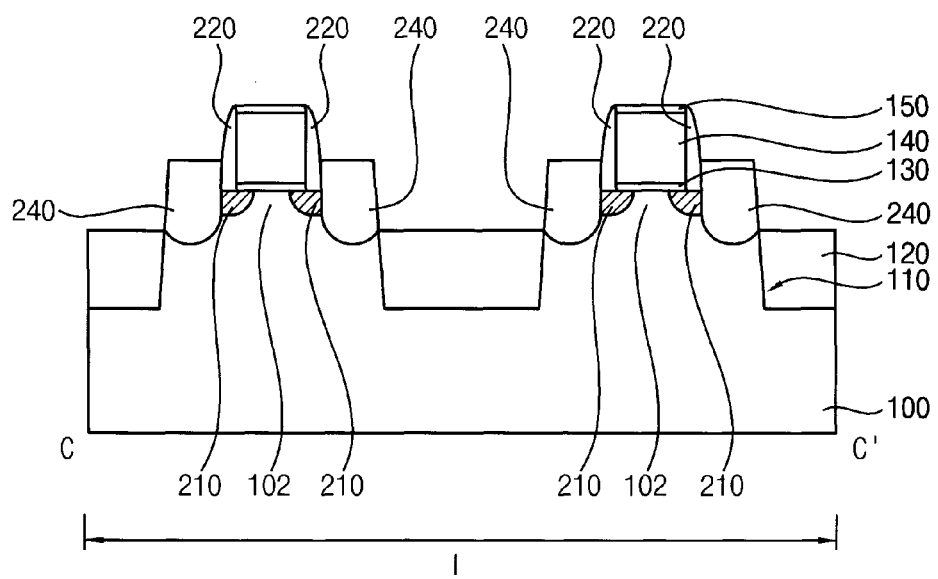
Figure 36:
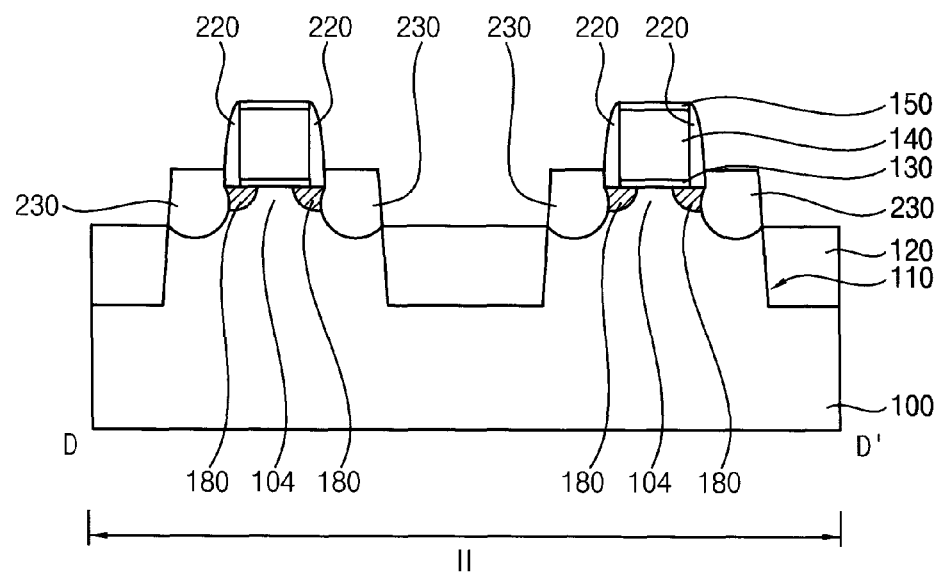
Figure 37:
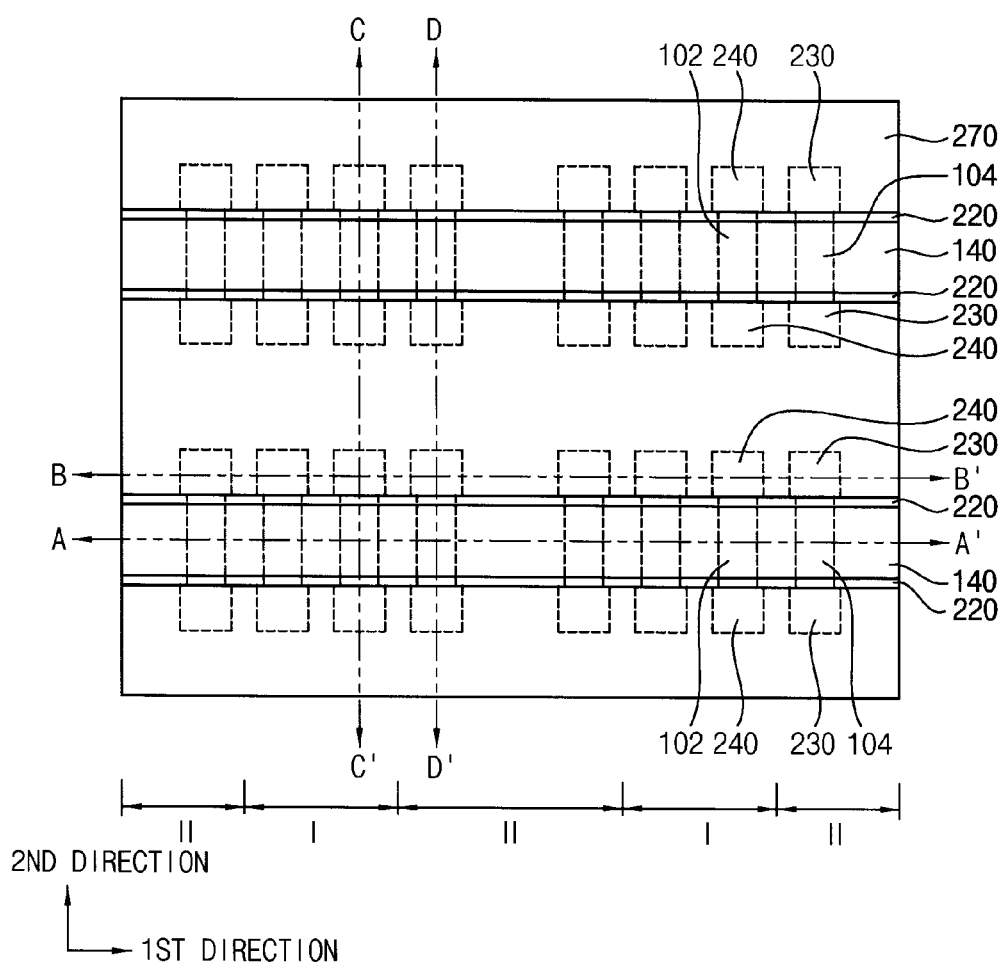
Figure 38:
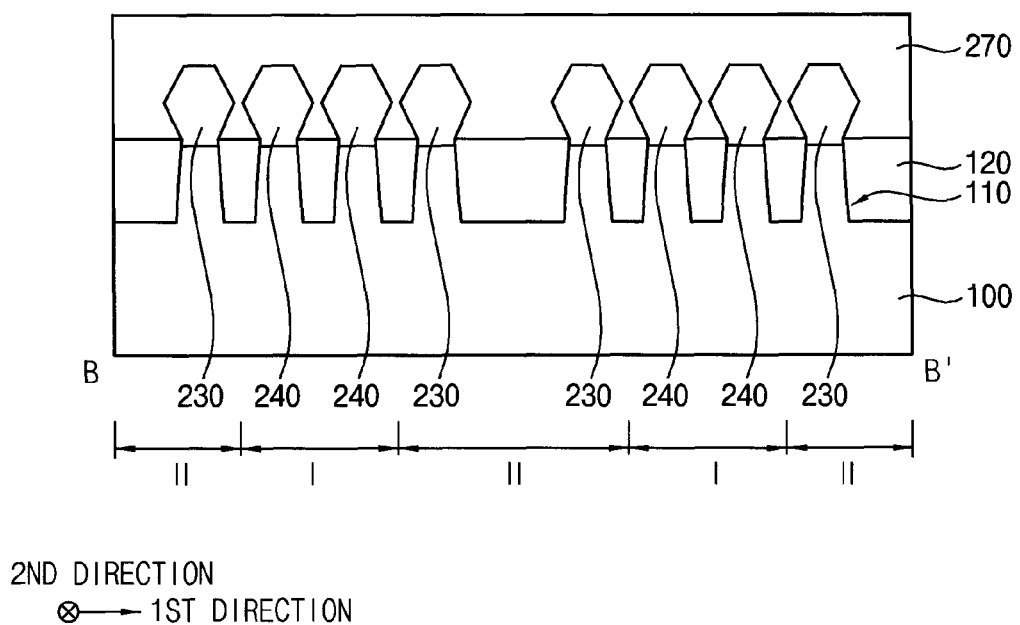
Figure 39:
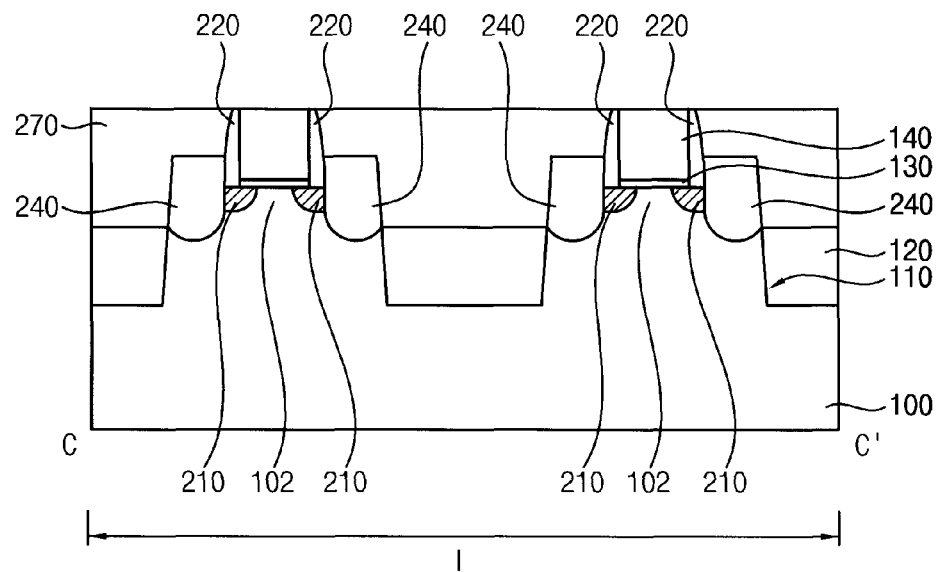
Figure 40:
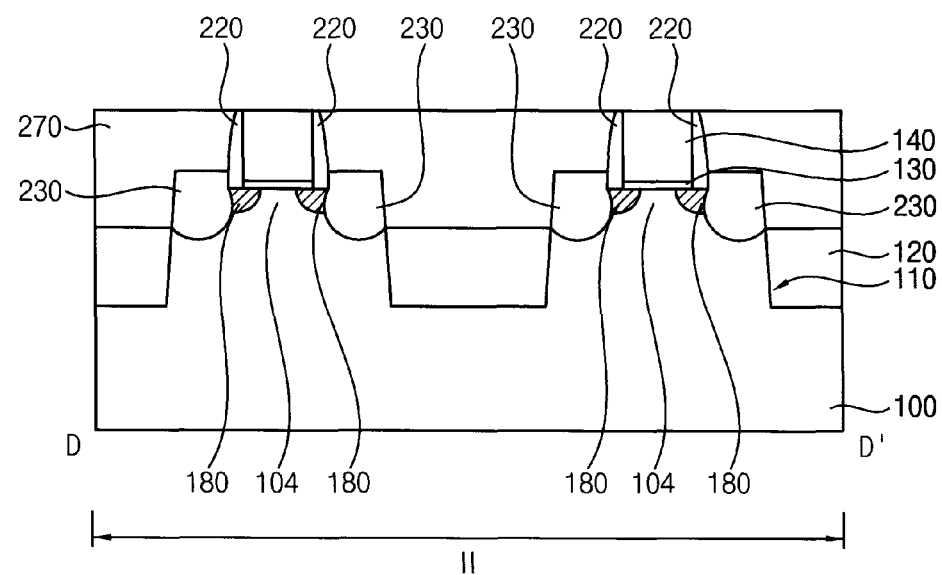

Referring to FIGS. 28 and 32, a spacer 220 may be formed on a sidewall of the dummy gate structure.

The spacer 220 may be formed by forming a spacer layer on the substrate 100 and the isolation layer pattern 120 to cover the dummy gate structure, and anisotropically etching the spacer layer. Thus, the spacer 220 may be formed to partially cover upper portions of the second and first impurity regions 210 and 180 in the first and second active regions 102 and 104, respectively.

The spacer layer may be formed to include a nitride, e.g., silicon nitride. The spacer layer may be formed by an ALD process or a CVD process.

Referring to FIGS. 33 to 36, upper portions of the second and first active regions 104 and 103 adjacent to the dummy gate structure may be etched to form first and second recesses (not shown), and first and second source/drain layers 230 and 240 filling the first and second recesses, respectively, may be formed.

Particularly, a portion of the second active regions 104 adjacent to the dummy gate structure may be partially etched to form the first recess, and thus a portion of the first impurity region 180 may be removed. In an example embodiment, the first recess may be formed to have a ball-like shape.

A selective epitaxial growth (SEG) process may be performed using a top surface of the second active regions 104 exposed by the first recess as a seed to form the first source/drain layer 230 filling the first recess. A top surface of the first source/drain layer 230 may contact a portion of the spacer 220.

The first source/drain layer 230 may be formed using a silicon source gas, e.g., dichlorosilane ($SiH_2Cl_2$) gas, and a germanium source gas, e.g., germane ($GeH_4$) gas so that a single crystalline silicon-germanium layer may be formed. In example embodiments, a p-type impurity source gas, e.g., diborane ($B_2H_6$) gas may be also used to form a single crystalline silicon-germanium layer doped with p-type impurities. Thus, the first source/drain layer 230 may serve as a source/drain region of a PMOS transistor. In example embodiments, the first source/drain layer 230 may grow both in vertical and horizontal directions, and an upper portion of the first source/drain layer 230 may have a cross-section taken along the first direction of which a shape may be a pentagon or hexagon.

A portion of the first active regions 102 adjacent to the dummy gate structure may be partially etched to form the second recess, and thus a portion of the second impurity region 210 may be removed. In an example embodiment, the second recess may be formed to have a U-like shape.

A SEG process may be performed using a top surface of the first active regions 102 exposed by the second recess as a seed to form the second source/drain layer 240 filling the second recess. A top surface of the second source/drain layer 240 may contact a portion of the spacer 220.

The second source/drain layer 240 may be formed using a silicon source gas, e.g., disilane ($Si_2H_6$) gas, and a carbon source gas, e.g., monomethylsilane ($SiH_3CH_3$) gas so that a single crystalline silicon carbide layer may be formed. Alternatively, the second source/drain layer 240 may be formed using a silicon source gas, e.g., disilane ($Si_2H_6$) gas so that a single crystalline silicon layer may be formed. In example embodiments, an n-type impurity source gas, e.g., phosphine ($PH_3$) gas may be also used to form a single crystalline silicon carbide layer or a single crystalline silicon layer doped with n-type impurities. Thus, the second source/drain layer 240 may serve as a source/drain region of an NMOS transistor. In example embodiments, the second source/drain layer 240 may grow both in vertical and horizontal directions, and an upper portion of the second source/drain layer 240 may have a cross-section taken along the first direction of which a shape may be a pentagon or hexagon.

In example embodiments, a top surface of the second source/drain layer 240 may be higher than that of the first source/drain layer 230, however, the present inventive concepts may not be limited thereto.

Referring to FIGS. 37 to 40, an insulating interlayer 270 may be formed on the substrate 100 and the isolation layer pattern 120 to sufficiently cover the dummy gate structure, the spacer 220 and the first and second source/drain layers 230 and 240, and may be planarized until a top surface of the dummy gate electrode 140 of the dummy gate structure may be exposed. The gate mask 150 of the dummy gate structure and an upper portion of the spacer 220 may be also removed. In example embodiments, the planarization process may be performed by a CMP process and/or an etch back process.

Figure 41:
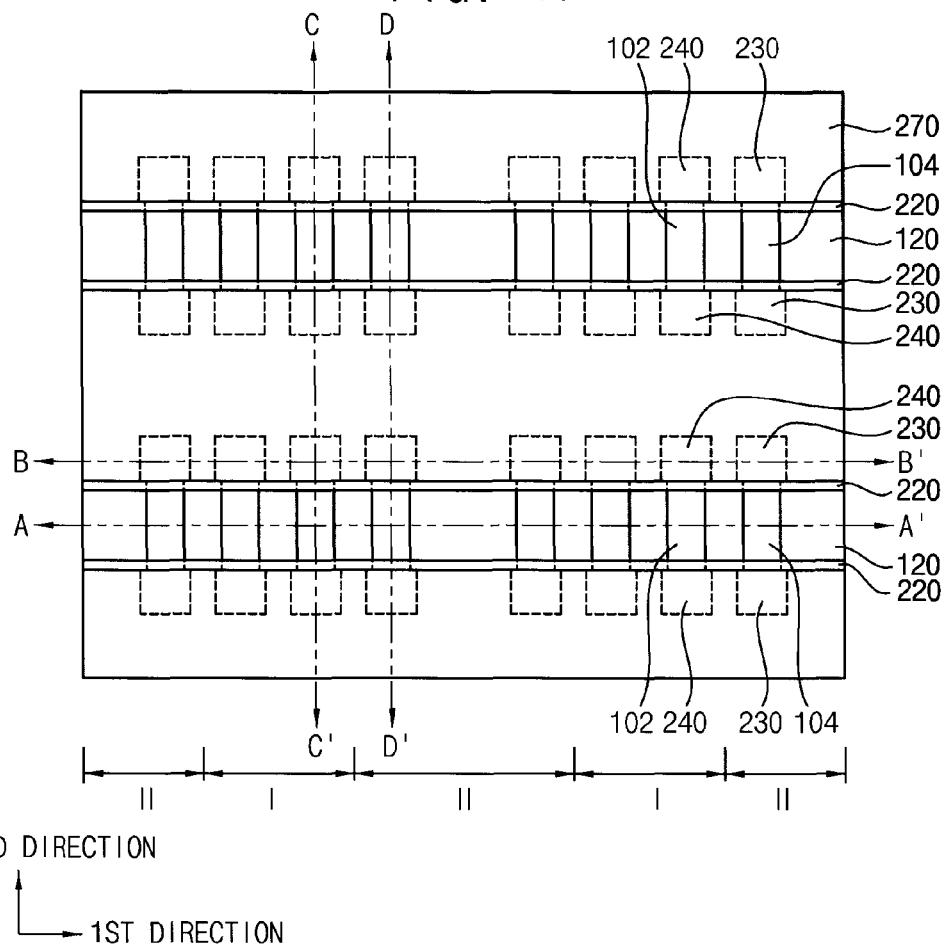
Figure 42:
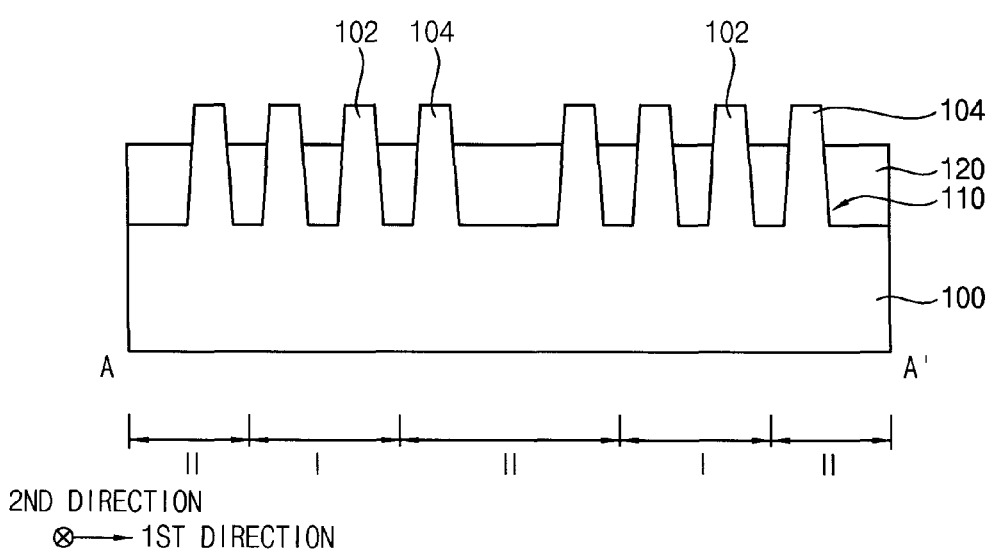
Figure 43:
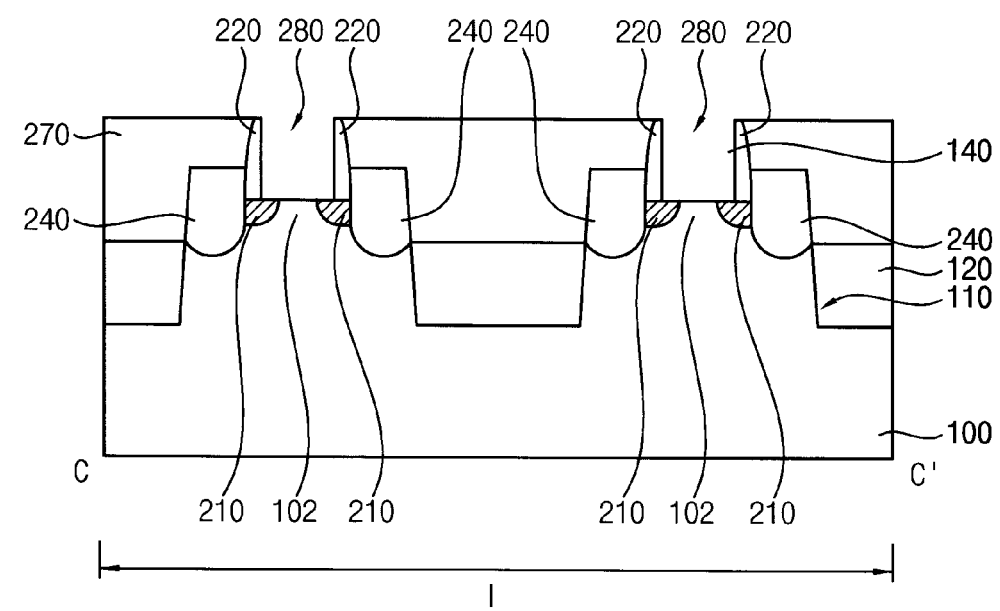
Figure 44:
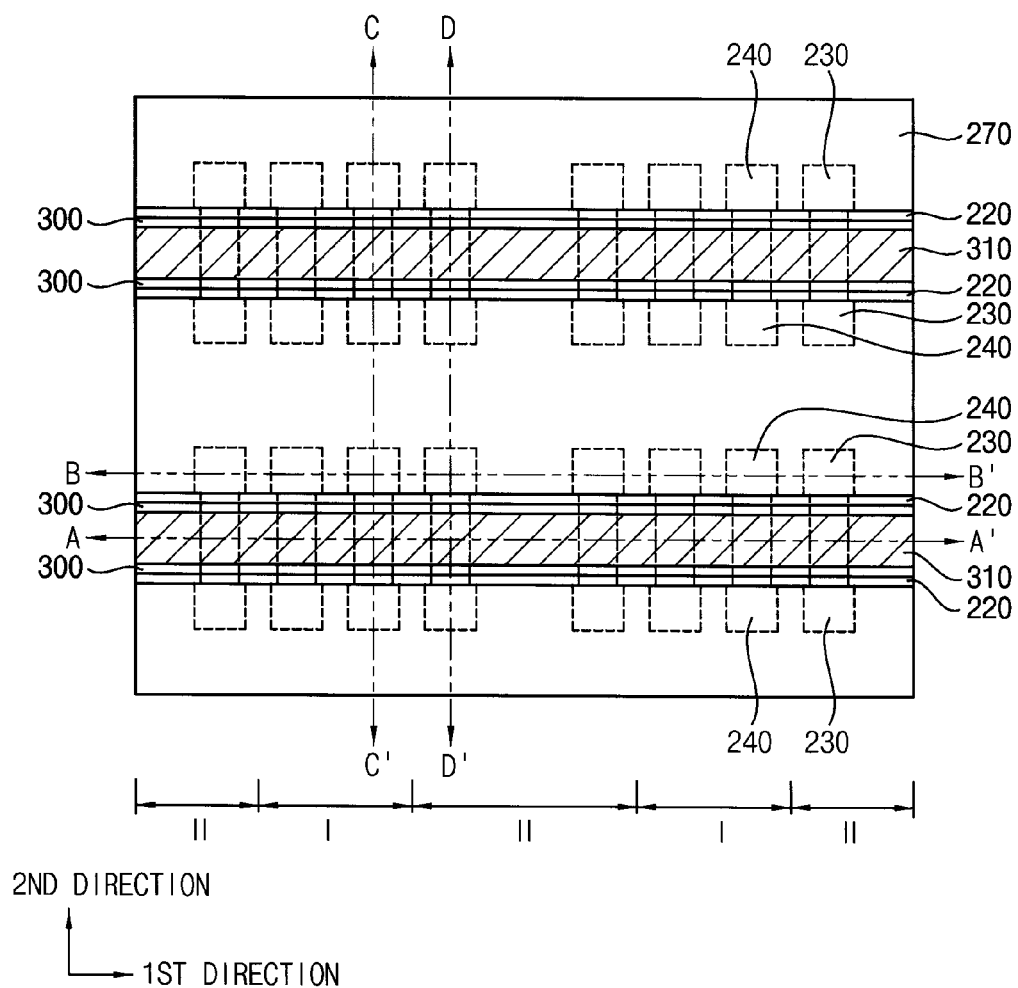
Figure 45:
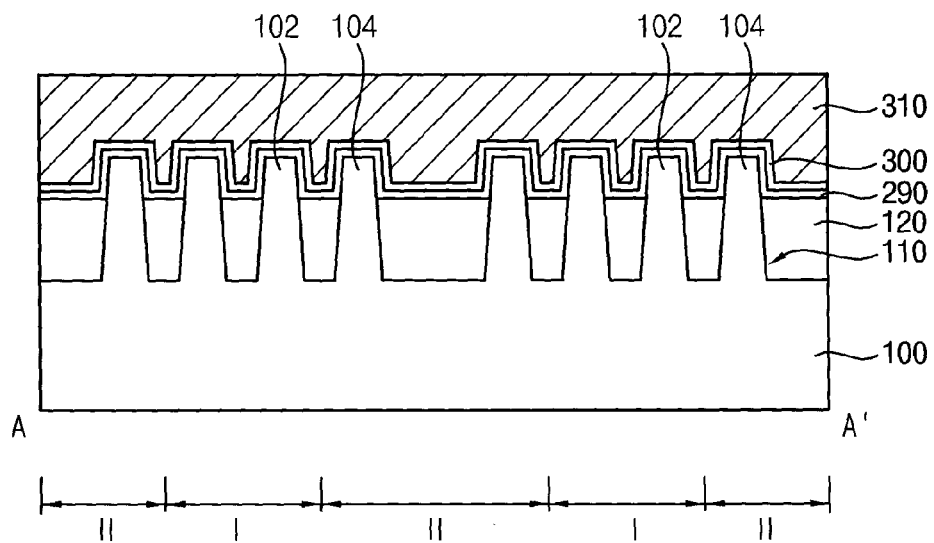
Figure 46:
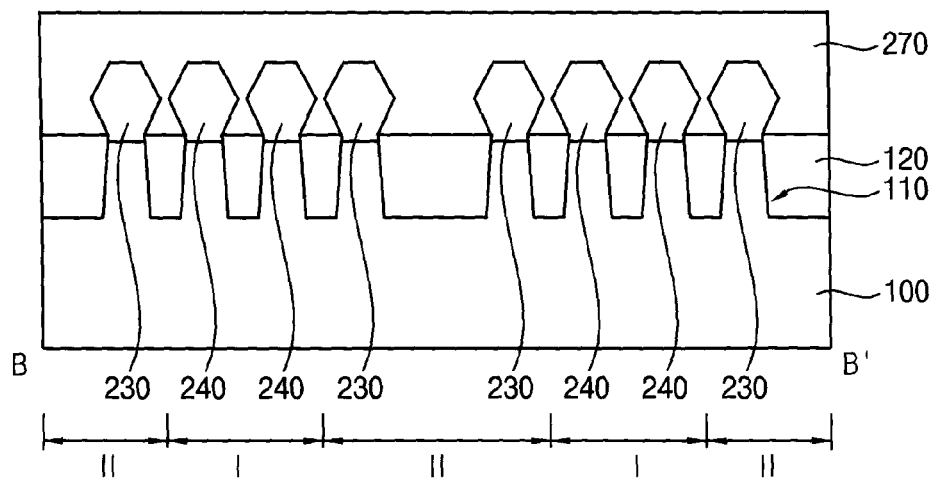
Figure 47:
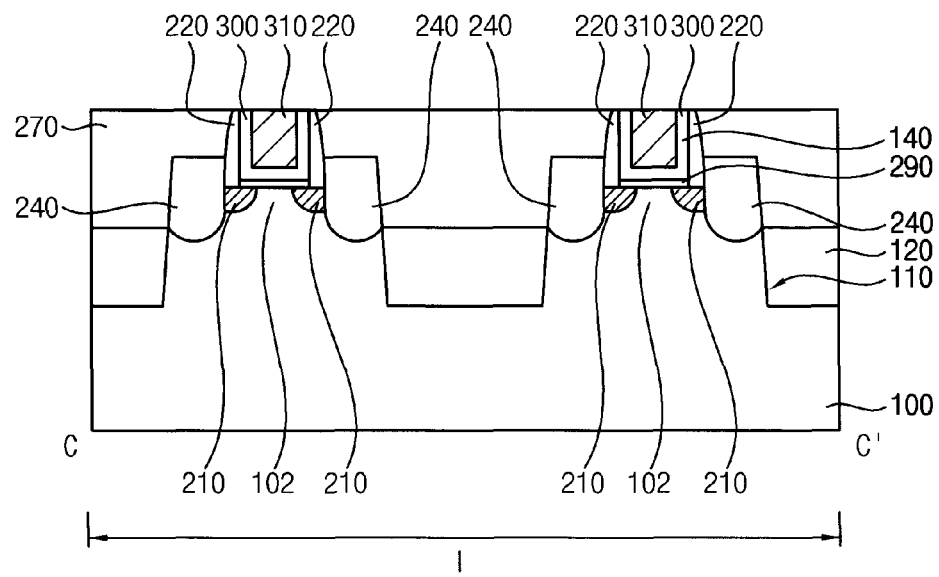
Figure 48:
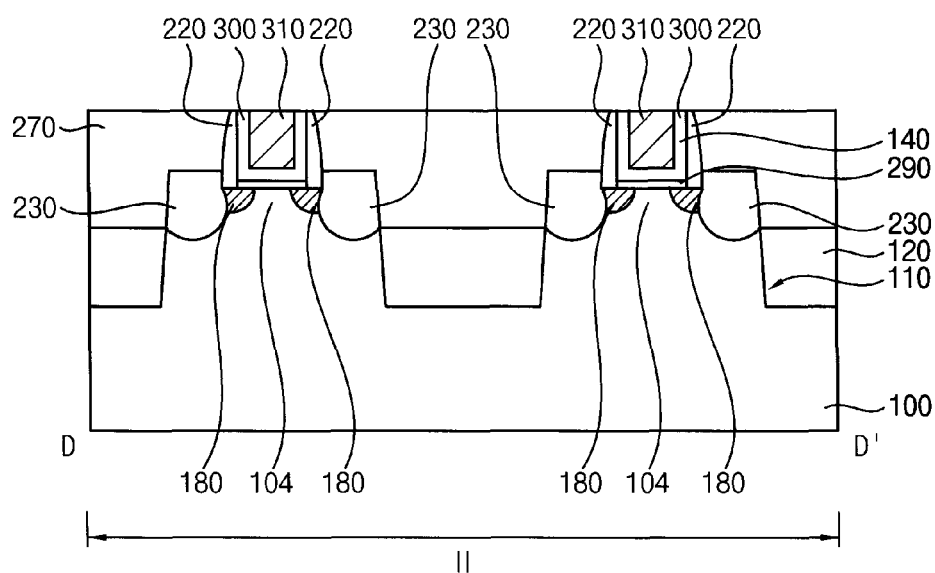

Referring to FIGS. 41 to 43, an exposed portion of the dummy gate electrode 140 and the dummy gate insulation layer pattern 130 may be removed to form an opening 280 exposing top surfaces of the first and second active regions 102 and 104.

In example embodiments, the dummy gate electrode 140 and the dummy gate insulation layer pattern 130 may be sufficiently removed by performing a dry etching process first and then a wet etching process. The wet etching process may be performed using hydrogen fluoride (HF) as an etching solution.

Referring to FIGS. 44 to 48, a gate structure filling the opening 280 may be formed.

Particularly, after performing a thermal oxidation process on the top surfaces of the first and second active regions 102 and 104 exposed by the opening 280 to form an oxide layer pattern 290, a high-k dielectric layer may be formed on the oxide layer pattern 290, a sidewall of the spacer 220, and the insulating interlayer 270, and a gate electrode layer may be formed on the high-k dielectric layer to sufficiently fill a remaining portion of the opening 280.

In example embodiments, the oxide layer pattern 290 may be formed to include silicon oxide.

The high-k dielectric layer may be formed to include a metal oxide having a high dielectric constant, e.g., hafnium oxide, tantalum oxide, zirconium oxide, or the like, by a CVD process or an ALD process. The gate electrode layer may be formed to include a material having a low resistance, e.g., a metal such as aluminum, copper, tantalum, etc., or a metal nitride thereof by a CVD process, an ALD process, a physical vapor deposition (PVD) process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed on the gate electrode layer. Alternatively, the gate electrode layer may be formed to include doped polysilicon.

The oxide layer pattern 290 may be formed by a CVD process, an ALD process, etc., instead of the thermal oxidation process, and in this case, the oxide layer pattern 290 may be formed not only on the first and second active regions 102 and 104 but also on the sidewall of the spacer 220.

The gate electrode layer and the high-k dielectric layer may be planarized until the top surface of the insulating interlayer 270 may be exposed to form a high-k dielectric layer pattern 300 on a top surface of the oxide layer pattern 290 and the sidewall of the spacer 220, and a gate electrode 310 filling the remaining portion of the opening 280 on the high-k dielectric layer pattern 300. Thus, a bottom and a sidewall of the gate electrode 310 may be covered by the high-k dielectric layer pattern 300. In example embodiments, the planarization process may be performed by a CMP process and/or an etch back process.

The oxide layer pattern 290, the high-k dielectric layer pattern 300 and the gate electrode 310 sequentially stacked may form the gate structure, and the gate structure and the first source/drain region 230 adjacent thereto in the second region II may form a PMOS transistor and the gate structure and the second source/drain layer 240 adjacent thereto in the first region I may form an NMOS transistor.

An additional insulating interlayer (not shown) covering the transistors may be formed, and contact plugs (not shown) and wirings (not shown) may be formed through the additional insulating interlayer to be electrically connected to the first and second source/drain layers 230 and 240 or the gate structure.

As illustrated above, in the method of manufacturing the semiconductor device, the developable first ARC layer 160 or the second ARC layer may be formed between the substrate 100 and the first photoresist layer 170 or between the substrate 100 and the second photoresist layer, and thus, when the first photoresist pattern 175 or the second photoresist pattern 205 is formed in the development process, the first ARC layer 160 or the second ARC layer thereunder may be also removed. Accordingly, the first ARC layer 160 or the second ARC layer may be removed with no additional etching process to expose the second active regions 104 or the first active regions 102 of the substrate 100, and thus the top surfaces thereof may not be damaged.

Particularly, the first ARC layer 160 or the second ARC layer may have the first height H1 equal to or greater than half of and equal to or less than the second height H2 of the first and second active regions 102 and 104. Thus, the diffused reflection of light may be reduced or prevented during the exposure process on the first photoresist layer 170 or the second photoresist layer, and even though the first ARC layer or the second ARC layer may be partially removed by an isotropical etching process during the development process, the first ARC layer pattern 165 or the second ARC layer pattern 195 may sufficiently cover the second active regions 104 or the first active regions 102. As a result, the first and second impurity regions 180 and 210 may be formed at desired portions of the substrate 100 with desired conductivity types, and thus the semiconductor device may have good electrical characteristics.

The above method of manufacturing the semiconductor device may be applied to methods of manufacturing various types of memory devices including an impurity region. For example, the method may be applied to logic devices such as central processing units (CPUs), main processing units (MPUs), or application processors (APs), or the like. Additionally, the method may be applied to volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming an isolation layer pattern on a substrate to define first and second active fins protruding from the isolation layer pattern;
    forming a first anti-reflective coating (ARC) layer on the isolation layer pattern to at least partially cover sidewalls of the first and second active fins, a level of a top surface of the first ARC layer being equal to or less than levels of top surfaces of the first and second active fins and being equal to or greater than half of those of the first and second active fins;
    forming a first photoresist layer on the first and second active fins and the first ARC layer;
    removing a portion of the first photoresist layer to form a first photoresist pattern covering the first active fin and exposing the second active fin, a portion of the first ARC layer under the removed portion of the first photoresist layer being also removed to form a first ARC layer pattern; and
    implanting impurities into the exposed second active fin to form a first impurity region.

2. The method of claim 1, wherein forming the first photoresist pattern includes:
    performing an exposure process on the first photoresist layer; and
    coating a developing solution on the first photoresist layer.

3. The method of claim 2, wherein the exposure process is performed using KrF, ArF, extreme ultra violet (EUV), vacuum ultra violet (VUV), electron beam, X-ray, or ion beam.

4. The method of claim 2, wherein the portion of the first ARC layer under the removed portion of the first photoresist layer is isotropically etched by the developing solution.

5. The method of claim 4, wherein the first active fin is covered by the first photoresist pattern and the first ARC layer pattern.

6. The method of claim 1, wherein the first ARC layer does not cover the top surfaces of the first and second active fins.

7. The method of claim 1, wherein the second active fin is covered neither by the first photoresist pattern nor by the first ARC layer pattern.

8. The method of claim 1, further comprising:
    removing the first photoresist pattern and the first ARC layer pattern after forming the first impurity region.

9. The method of claim 8, after removing the first photoresist pattern and the first ARC layer pattern, further comprising:
    forming a second ARC layer on the isolation layer pattern to at least partially cover the sidewalls of the first and second active fins, a level of a top surface of the second ARC layer being equal to or less than those of the first and second active fins and being equal to or greater than half of those of the first and second active fins;
    forming a second photoresist layer on the first and second active fins and the second ARC layer;
    removing a portion of the second photoresist layer to form a second photoresist pattern covering the second active fin and exposing the first active fin, a portion of the second ARC layer under the removed portion of the second photoresist layer being also removed to form a second ARC layer pattern; and
    implanting impurities into the exposed first active fin to form a second impurity region.

10. The method of claim 9, wherein the first and second impurity regions include impurities having different conductivity type.

11. The method of claim 8, wherein the first photoresist pattern and the first Arc layer pattern are removed by an ashing process and/or a stripping process.

12. The method of claim 1, prior to forming the first ARC layer on the isolation layer pattern, further comprising forming a dummy gate structure on the first and second active fins, wherein the first impurity region is formed at an upper portion of the second active fin adjacent to the dummy gate structure.

13. The method of claim 12, wherein forming the dummy gate structure includes forming a dummy gate insulation layer pattern and a dummy gate electrode sequentially stacked on the first and second active fins.

14. The method of claim 13, after forming the first impurity region, further comprising:
    forming a spacer on a sidewall of the dummy gate structure;
    forming an insulating interlayer surrounding the dummy gate structure and the spacer;
    removing the dummy gate electrode and the dummy gate insulation layer pattern to form an opening exposing top surfaces of the first and second active fins;
    forming a high-k dielectric layer pattern on the exposed top surfaces of the first and second active fins and a sidewall of the opening; and
    forming a gate electrode to fill a remaining portion of the opening, the high-k dielectric layer pattern and the gate electrode forming a gate structure.

15. The method of claim 14, prior to forming the high-k dielectric layer pattern, further comprising forming an oxide layer pattern on the exposed top surfaces of the first and second active fins.

16. The method of claim 12, after forming the first impurity region, further comprising:
    forming a spacer on a sidewall of the dummy gate structure;
    removing an upper portion of the second active fin covered neither by the dummy gate structure nor by the spacer to form a recess; and
    forming a source/drain layer on the recess.

17. A method of manufacturing a semiconductor device, the method comprising:
- forming an isolation layer pattern on a substrate to define first and second active fins protruding from the isolation layer pattern;
- forming an anti-reflective coating (ARC) layer on the isolation layer pattern to at least partially cover sidewalls of the first and second active fins, a top surface of the ARC layer being equal to or greater than half of those of the first and second active fins;
- forming a photoresist layer on the first and second active fins and the ARC layer;
- performing an exposure process and a development process on the photoresist layer to remove a portion of the photoresist layer so that a photoresist pattern overlapping the first active fin and not overlapping the second active fin is formed, wherein a portion of the ARC layer under the removed portion of the photoresist layer is also removed to form an ARC layer pattern covering at least a lower sidewall of the first active fin and not covering the second active fin, the second active fin being exposed; and
- implanting impurities into the exposed second active fin to form an impurity region.

18. The method of claim 17, wherein the ARC layer does not cover top surfaces of the first and second active fins.

19. The method of claim 17, wherein the ARC layer covers top surfaces of the first and second active fins.

20. A method of manufacturing a semiconductor device, the method comprising:
- forming an isolation layer pattern on a substrate to define a plurality of active fins protruding from the isolation layer pattern;
- forming an anti-reflective coating (ARC) layer on the isolation layer pattern to at least partially cover sidewalls of the active fins, a level of a top surface of the ARC layer being less than levels of top surfaces of the active fins;
- forming a photoresist layer on the active fins and the ARC layer;
- removing a portion of the photoresist layer to form a photoresist pattern covering some of the plurality of active fins and exposing others of the plurality of active fins, a portion of the ARC layer under the removed portion of the photoresist layer being also removed to form an ARC layer pattern; and
- implanting impurities into the exposed active fins to form an impurity region.

* * * * *